(12) United States Patent
Kamada

(10) Patent No.: US 9,741,662 B2
(45) Date of Patent: Aug. 22, 2017

(54) SEMICONDUCTOR DEVICE AND METHOD OF MANUFACTURING THE SAME, AND POWER SUPPLY APPARATUS

(71) Applicant: FUJITSU LIMITED, Kawasaki-shi, Kanagawa (JP)

(72) Inventor: Youichi Kamada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 82 days.

(21) Appl. No.: 14/566,816

(22) Filed: Dec. 11, 2014

(65) Prior Publication Data

US 2015/0091173 A1    Apr. 2, 2015

Related U.S. Application Data

(62) Division of application No. 13/326,253, filed on Dec. 14, 2011, now abandoned.

(30) Foreign Application Priority Data

Feb. 25, 2011    (JP) ................. 2011-039949

(51) Int. Cl.
*H01L 23/48*    (2006.01)
*H01L 21/4763*    (2006.01)
(Continued)

(52) U.S. Cl.
CPC .. *H01L 23/53223* (2013.01); *H01L 21/76841* (2013.01); *H01L 21/823475* (2013.01);
(Continued)

(58) Field of Classification Search
CPC .............. H01L 29/452; H01L 29/4966; H01L 29/66462; H01L 29/7787; H01L 29/41766;
(Continued)

(56) References Cited

U.S. PATENT DOCUMENTS 6,346,745 B1 *  2/2002  Nogami ............ H01L 23/53233
                                                              257/751
6,730,955 B2     5/2004  Shinohara et al.
(Continued)

FOREIGN PATENT DOCUMENTS

CN    1682259    10/2005
CN    1917232    2/2007
(Continued)

OTHER PUBLICATIONS

Japanese Office Action mailed Jun. 3, 2014 for corresponding Japanese Patent Application 2011-039949 with English Translation.
(Continued)

*Primary Examiner* — Fei Fei Yeung Lopez
*Assistant Examiner* — Junaiden Mirsalahuddin
(74) *Attorney, Agent, or Firm* — Fujitsu Patent Center

(57) ABSTRACT

A semiconductor device includes an electrode material diffusion suppression layer provided either between a gate electrode and a gate insulation film, between Al-containing ohmic electrodes and an Au interconnection, and below the gate electrode and above the Al-containing ohmic electrodes, the electrode material diffusion suppression layer having a structure wherein a first the TaN layer, a Ta layer, and a second the TaN layer are stacked in sequence.

9 Claims, 28 Drawing Sheets

(51) Int. Cl.

| | | |
|---|---|---|
| *H01L 23/532* | (2006.01) | |
| *H01L 29/45* | (2006.01) | |
| *H01L 29/49* | (2006.01) | |
| *H01L 29/66* | (2006.01) | |
| *H01L 29/778* | (2006.01) | |
| *H01L 21/768* | (2006.01) | |
| *H01L 21/8234* | (2006.01) | |
| H01L 29/20 | (2006.01) | |
| H01L 29/417 | (2006.01) | |

(52) U.S. Cl.
CPC ...... *H01L 23/53252* (2013.01); *H01L 29/452* (2013.01); *H01L 29/454* (2013.01); *H01L 29/4966* (2013.01); *H01L 29/66462* (2013.01); *H01L 29/7787* (2013.01); H01L 29/2003 (2013.01); *H01L 29/41766* (2013.01); *H01L 2224/05553* (2013.01); *H01L 2224/0603* (2013.01); *H01L 2224/11* (2013.01); *H01L 2224/48247* (2013.01); *H01L 2224/48472* (2013.01); *H01L 2224/4903* (2013.01); *H01L 2924/181* (2013.01)

(58) Field of Classification Search
CPC ....... H01L 29/2003; H01L 2224/05553; H01L 2224/0603; H01L 2224/11; H01L 2224/48247; H01L 2224/48472; H01L 2224/4903; H01L 21/823475; H01L 23/53252; H01L 21/76841; H01L 23/53223; H01L 29/45; H01L 29/454
See application file for complete search history.

(56) References Cited

U.S. PATENT DOCUMENTS

| | | | |
|---|---|---|---|
| 6,740,561 | B2 | 5/2004 | Yoshida et al. |
| 6,861,712 | B2 | 3/2005 | Gao et al. |
| 6,887,752 | B2 | 5/2005 | Shinohara et al. |
| 7,473,640 | B2 | 1/2009 | Conley, Jr. et al. |
| 7,564,106 | B2 | 7/2009 | Fujiwara |
| 2002/0046874 | A1 | 4/2002 | Cabral et al. |
| 2002/0132426 | A1 | 9/2002 | Shinohara et al. |
| 2002/0151129 | A1 | 10/2002 | Yoshida et al. |
| 2004/0079982 | A1 | 4/2004 | Shinohara et al. |
| 2004/0137703 | A1 | 7/2004 | Gao et al. |
| 2004/0164362 | A1 | 8/2004 | Conley, Jr. et al. |
| 2005/0087879 | A1 | 4/2005 | Won et al. |
| 2005/0095867 | A1* | 5/2005 | Shimada .................. C23F 4/00 438/720 |
| 2006/0261338 | A1 | 11/2006 | Yamazaki et al. |
| 2007/0126062 | A1 | 6/2007 | Akiyama et al. |
| 2007/0200186 | A1 | 8/2007 | Fujiwara |
| 2008/0042173 | A1* | 2/2008 | Nam ................ H01L 21/28088 257/288 |
| 2008/0157382 | A1 | 7/2008 | Chinthakindi et al. |
| 2008/0197453 | A1 | 8/2008 | Kanamura et al. |
| 2010/0032716 | A1* | 2/2010 | Sato .................... H01L 29/7787 257/192 |
| 2010/0072583 | A1 | 3/2010 | Oikawa et al. |
| 2010/0176421 | A1* | 7/2010 | Van Hove ......... H01L 21/28587 257/194 |
| 2010/0320547 | A1 | 12/2010 | Ando et al. |
| 2012/0138999 | A1* | 6/2012 | Okabe ................. H01L 33/405 257/98 |

FOREIGN PATENT DOCUMENTS

| | | |
|---|---|---|
| JP | 10-270688 | 10/1998 |
| JP | 2002-280523 | 9/2002 |
| JP | 2002-299471 | 10/2002 |
| JP | 2005-093674 | 4/2005 |
| JP | 2005-244186 | 9/2005 |
| JP | 2006-173386 | 6/2006 |
| JP | 2007-180137 | 7/2007 |
| JP | 2009-076673 | 4/2009 |
| JP | 2009-164228 | 7/2009 |
| WO | 2004/027740 | 4/2004 |

OTHER PUBLICATIONS

Chinese Office Action mailed Mar. 3, 2014 for corresponding Chinese Patent Application 201210044579.2 with English Translation.
USPTO, (Mirsalahuddin) Final Rejection, Sep. 11, 2014, in parent pending U.S. Appl. No. 13/326,253.
USPTO, (Mirsalahuddin) Non-Final Rejection, Apr. 29, 2014, in parent pending U.S. Appl. No. 13/326,253.
USPTO, (Mirsalahuddin) Advisory Action, Feb. 21, 2014, in parent pending U.S. Appl. No. 13/326,253.
USPTO, (Mirsalahuddin) Final Rejection, Oct. 24, 2013, in parent pending U.S. Appl. No. 13/326,253.
USPTO, (Mirsalahuddin) Non-Final Rejection, Jun. 12, 2013, in parent pending U.S. Appl. No. 13/326,253.
USPTO, (Mirsalahuddin) Restriction Requirement, Mar. 5, 2013, in parent pending U.S. Appl. No. 13/326,253.

* cited by examiner

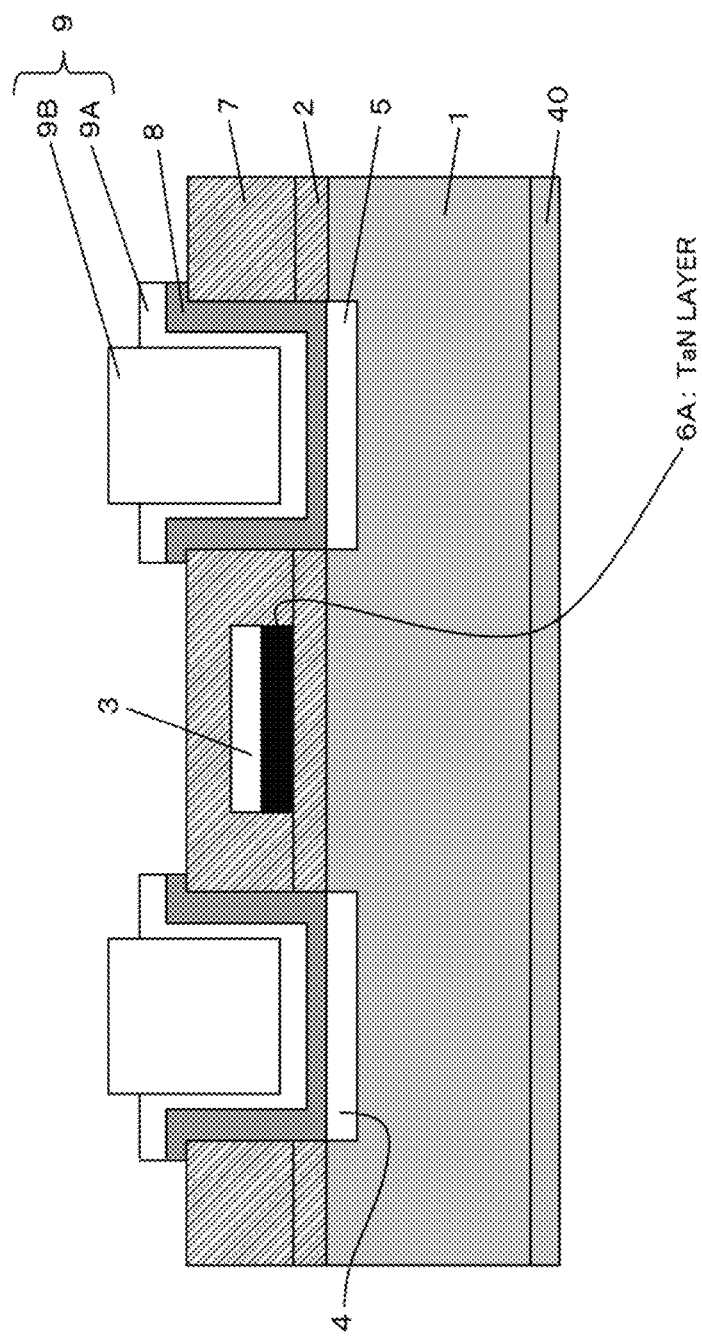

BEFORE THERMAL TREATMENT

AFTER THERMAL TREATMENT

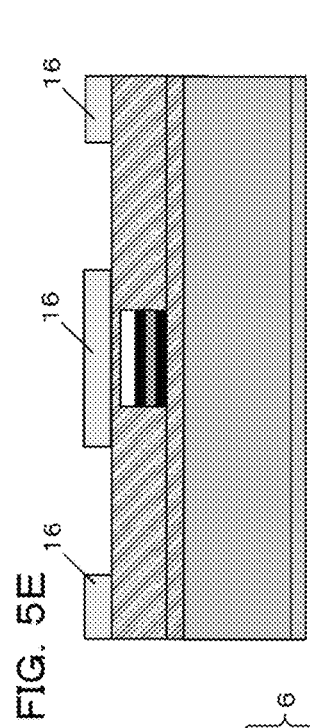
FIG. 5A
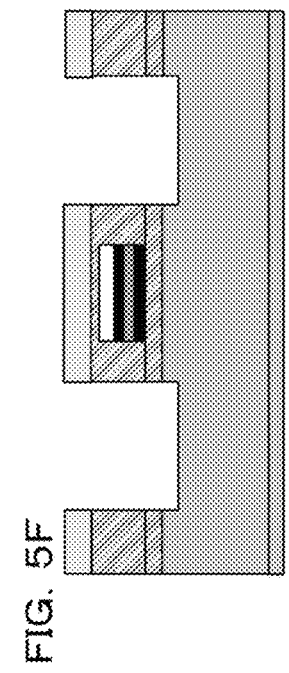
FIG. 5B
FIG. 5C
FIG. 5D
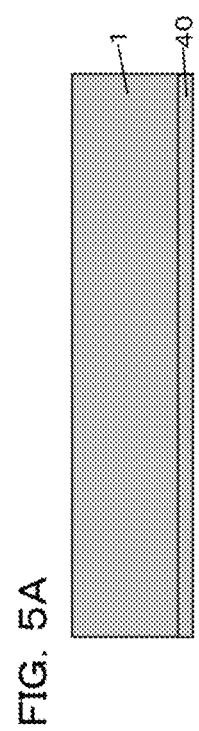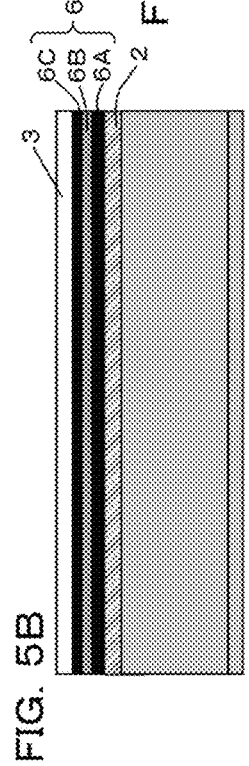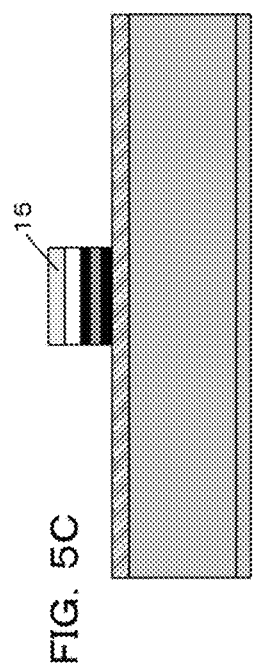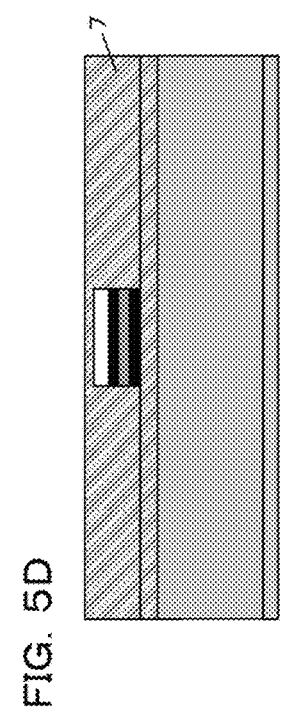
FIG. 5E
FIG. 5F
FIG. 5G

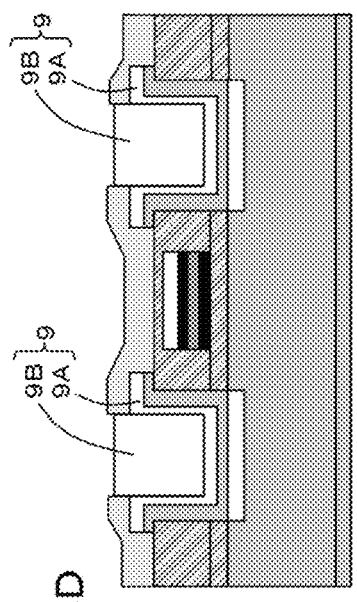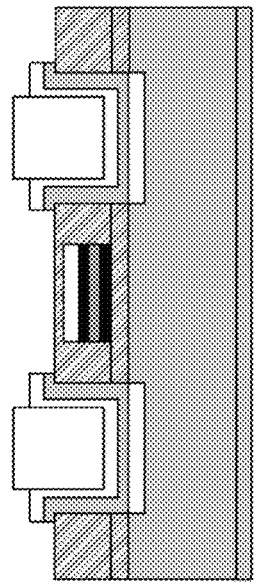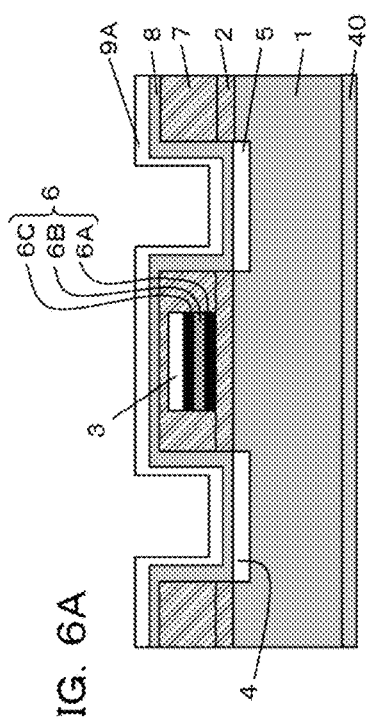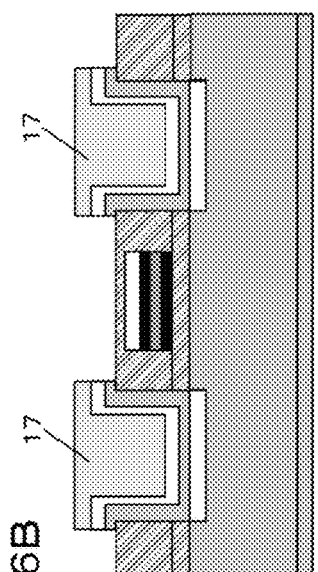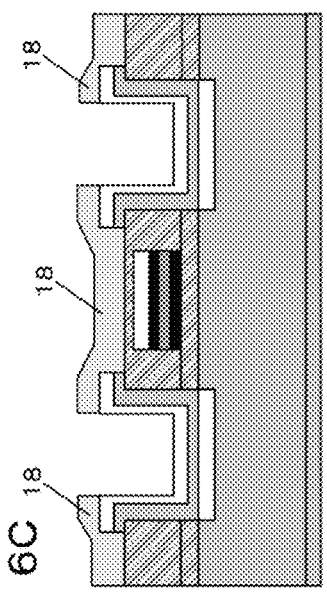

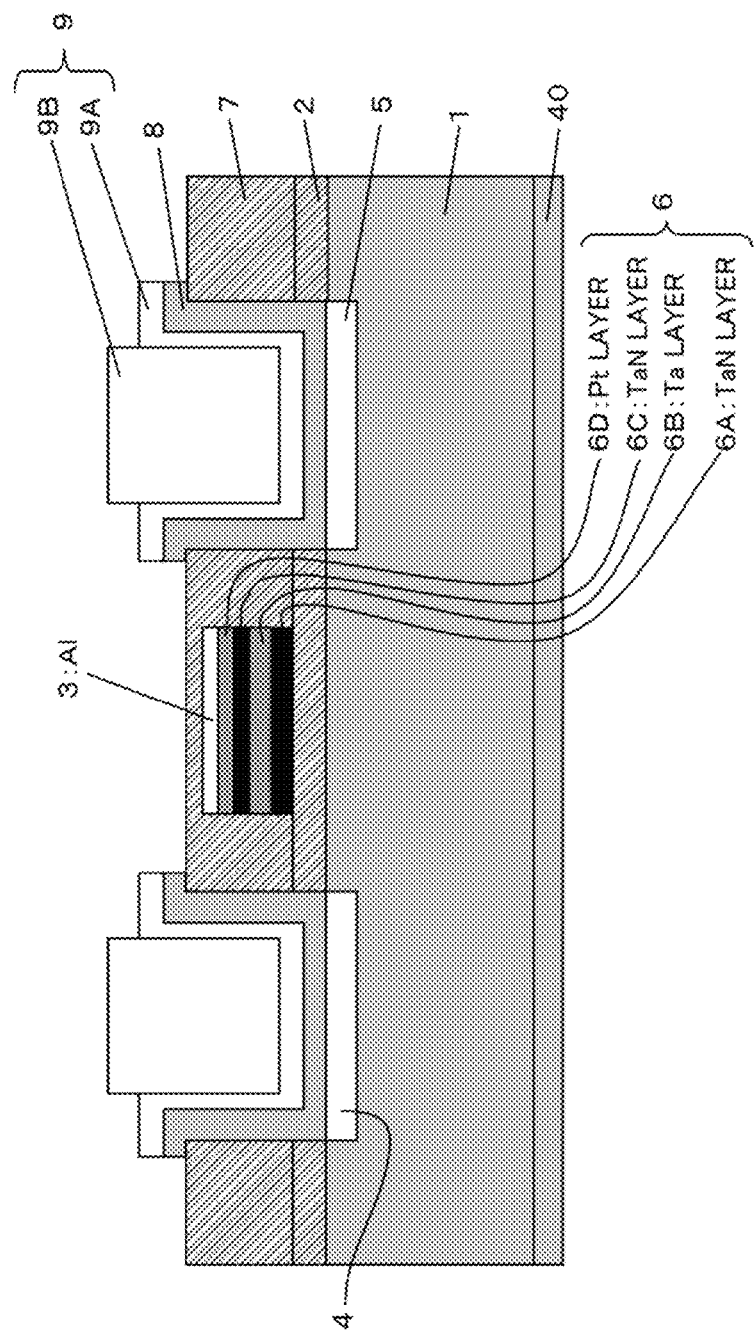

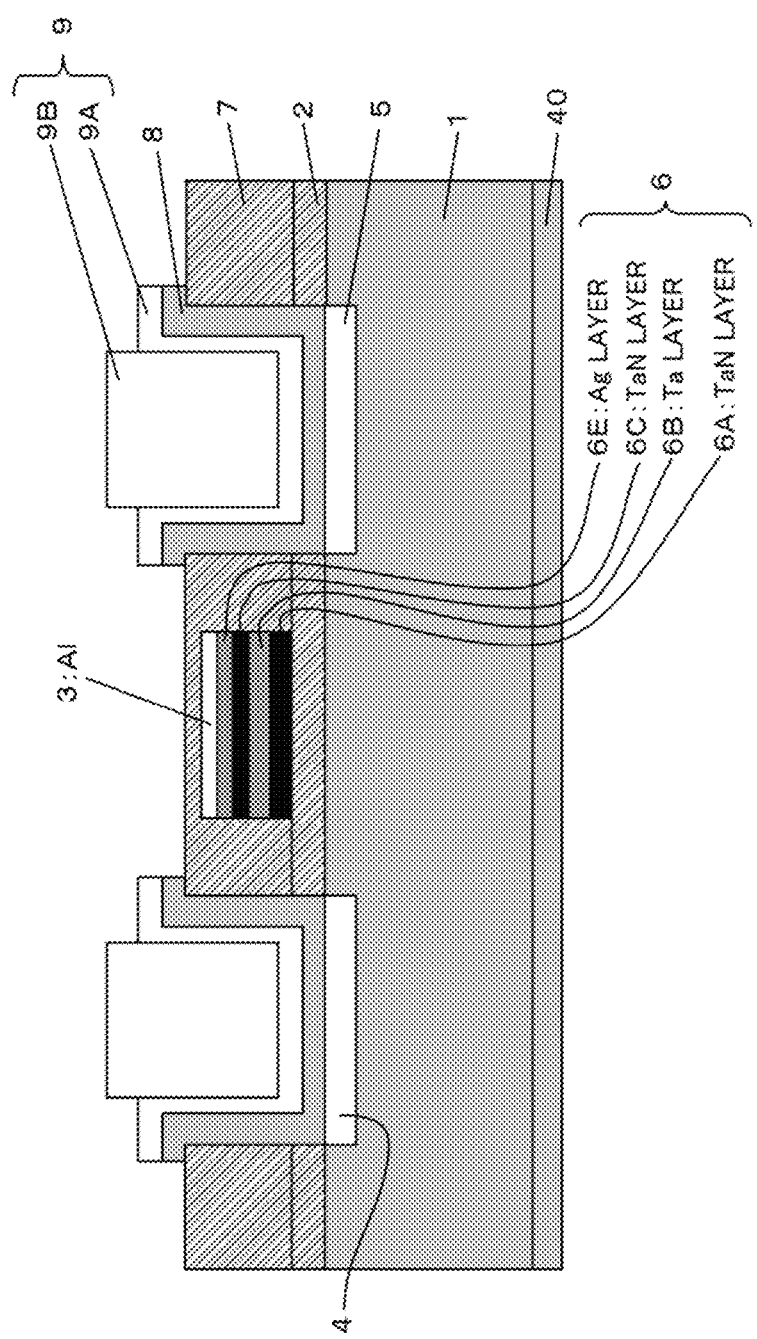

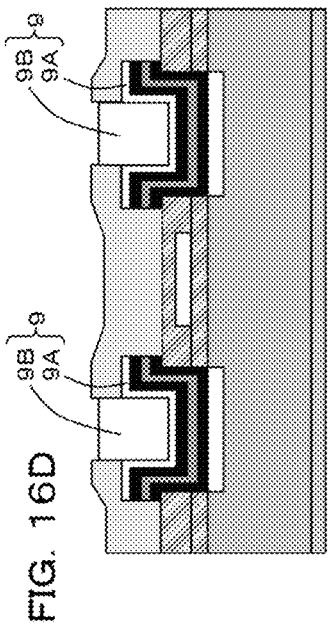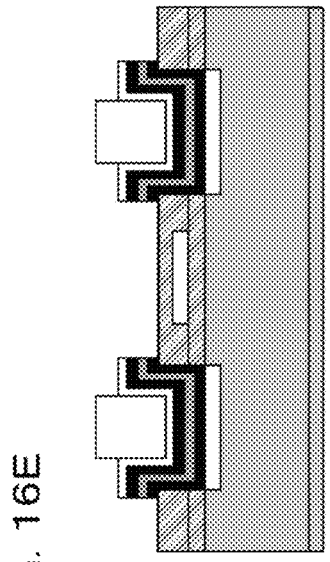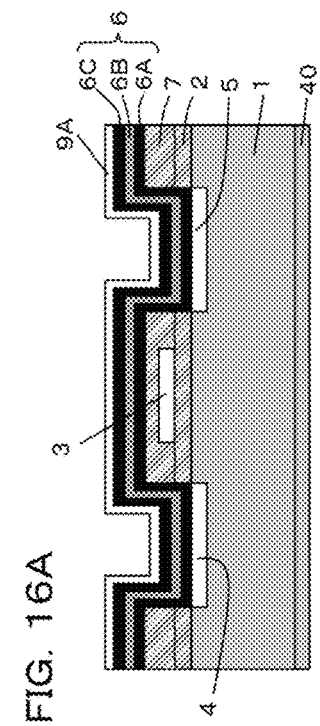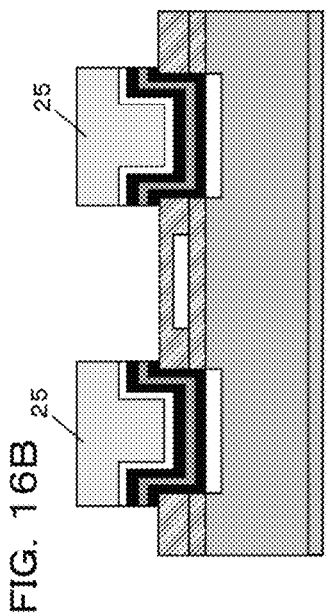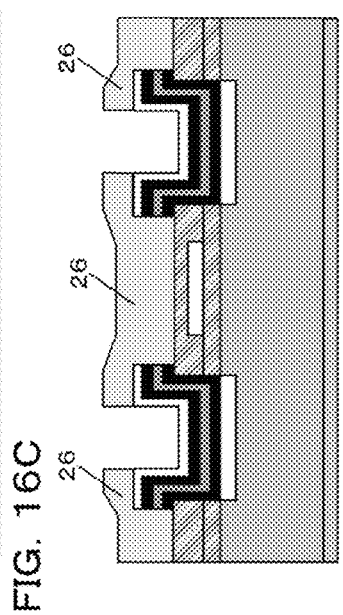

SEMICONDUCTOR DEVICE AND METHOD OF MANUFACTURING THE SAME, AND POWER SUPPLY APPARATUS

CROSS-REFERENCE TO RELATED APPLICATION

This application is a divisional of application Ser. No. 13/326,253, filed Dec. 14, 2011, which is based upon and claims the benefit of priority of the prior Japanese Patent Application No. 2011-039949, filed on Feb. 25, 2011, the entire contents of which are incorporated herein by reference.

FIELD

The embodiments discussed herein are related to a semiconductor device and a method of manufacturing the same, and a power supply apparatus.

BACKGROUND

In recent years, field-effect transistors using a nitride semiconductor, particularly, GaN-based transistors, are expected to be applied to devices with a higher withstanding voltage and a higher output, also known as power devices, employed in server systems, for example, in view of their physical characteristics. They are also expected to be applied to high-output amplifiers employed in base stations, such as wireless base stations, for their lower power consumptions.

In addition, efforts have been made for research and development of GaN-based transistors having a metal insulator semiconductor (MIS) structure. An MIS structure includes a gate insulation film between a gate electrode and a semiconductor layer, for the purpose of suppressing leak currents, from the gate electrode, which adversely affect the characteristics of the GaN-based transistor.

In order to further improve the characteristics of GaN-based transistors, GaN-based transistors capable of operating under higher currents or in a high-temperature environment are needed to be developed. Currently, a GaN-based transistor includes electrodes including an Al layer, as ohmic electrodes, and further includes interconnections made of gold (Au) which is a low-resistance interconnection material, as interconnections. When a GaN-based transistor in such a structure is operated with a direct contact of the Au interconnection and the Al layer, an Au—Al compound is readily formed, which causes an increase in the resistance. For preventing this phenomenon, provision of a single Pt layer, Ta layer, TaN layer, TiWN layer and so forth, as a barrier metal layer, has been proposed, between the Au interconnection and the Al layer.

SUMMARY

A semiconductor device and a power supply apparatus include a gate electrode; a gate insulation film; and an electrode material diffusion suppression layer, provided between the gate electrode and the gate insulation film, including a first TaN layer, a Ta layer, and a second TaN layer stacked in sequence.

A semiconductor device and a power supply apparatus include an ohmic electrode including an Al layer; an Au interconnection; and an electrode material diffusion suppression layer, provided between the Al layer and the Au interconnection, including a first TaN layer, a Ta layer, and a second TaN layer stacked in sequence.

A semiconductor device and a power supply apparatus include a first electrode material diffusion suppression layer, provided under a gate electrode, including a TaN layer, a Ta layer, and a TaN layer stacked in sequence; and a second electrode material diffusion suppression layer, provided over an ohmic electrode, including a TaN layer, a Ta layer, and a TaN layer stacked in sequence.

Furthermore, a method of manufacturing a semiconductor device includes forming a gate insulation film; forming an electrode material diffusion suppression layer over the gate insulation film by stacking a first TaN layer, a Ta layer, and a second TaN layer, in sequence; and forming a gate electrode over the electrode material diffusion suppression layer.

Furthermore, a method of manufacturing a semiconductor device includes forming an ohmic electrode including an Al layer; forming an electrode material diffusion suppression layer by stacking a first TaN layer, a Ta layer, and a second TaN layer, in sequence, over the Al layer; and forming an Au interconnection over the electrode material diffusion suppression layer.

A method of manufacturing a semiconductor device includes forming a first electrode material diffusion suppression layer by stacking a TaN layer, a Ta layer, and a TaN layer, in sequence; forming a gate electrode over the first electrode material diffusion suppression layer; forming an ohmic electrode; and forming a second electrode material diffusion suppression layer by stacking a TaN layer, a Ta layer, and a TaN layer, in sequence, over the ohmic electrode.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 3 is a schematic cross-sectional view illustrating the issues of the semiconductor device according to the first embodiment;

FIGS. 5A to 5G are schematic cross-sectional views illustrating a method of manufacturing a semiconductor device according to the first embodiment;

FIGS. 6A to 6E are schematic cross-sectional views illustrating the method of manufacturing a semiconductor device according to the first embodiment;

FIG. 7 is a schematic cross-sectional view illustrating the structure of a semiconductor device according to a second embodiment;

FIG. 8 is a schematic cross-sectional view illustrating the structure of a semiconductor device according to a third embodiment;

FIGS. 12A to 12D are diagrams illustrating the issues of the semiconductor device according to the sixth embodiment, wherein: FIG. 12A is a micrograph before a thermal degradation accelerated test; FIG. 12B is a micrograph illustrating an Au—Al compound formed when an electrode material diffusion suppression layer degrades during the thermal degradation accelerated test; FIGS. 12C and 12D are graphs illustrating the time durations until the electrode material diffusion suppression layer degrades and an Au—Al compound is formed (time durations from the state in FIG. 12A to the state in FIG. 12B; reaction times) for each candidate of the electrode material diffusion suppression layer;

FIGS. 16A to 16E are schematic cross-sectional views illustrating the method of manufacturing a semiconductor device according to the sixth embodiment;

DESCRIPTION OF EMBODIMENTS

In a transistor including a gate insulation film between a gate electrode and a semiconductor layer, the material of the gate electrode diffuses into the gate insulation film due to a thermal treatment (an annealing process) performed during the manufacturing process or heat generation during a transistor operation, for example, which causes deterioration of the characteristics.

In addition, it was turned out that only provision of a single barrier metal layer, such as Pt layer, Ta layer, TaN layer and so forth, between an Al layer included in ohmic electrodes and an Au interconnection, is not effective enough for improving the characteristics. More specifically, it was found that it is difficult, only with provision of such a layer, to suppress an inter-diffusion of Al and Au causing an increase in the resistance, while preventing an increase in the resistivity of these layers and preventing increased heat generation and power consumption during a transistor operation, thereby improving the characteristics.

Accordingly, it is desirable to suppress diffusion of the electrode material and to achieve improved characteristics.

Hereinafter, a semiconductor device and a method of manufacturing the same, and a power supply apparatus according to present embodiments will be described with reference to the drawings.

First Embodiment

A semiconductor device and a method of manufacturing the same according to a first embodiment will be described with reference to FIGS. 1-6E.

The semiconductor device according to this embodiment is a field-effect transistor using a nitride semiconductor, i.e., a high electron mobility transistor (HEMT) including a GaN-based semiconductor stacked structure (GaN-HEMT) on a semiconductor substrate, in this embodiment. This semiconductor device is also a MIS-type transistor including a gate insulation film. Note that such a semiconductor device is also referred to as a compound semiconductor device. Furthermore, a GaN-based semiconductor stacked structure is also referred to as a nitride semiconductor stacked structure.

Figure 2:
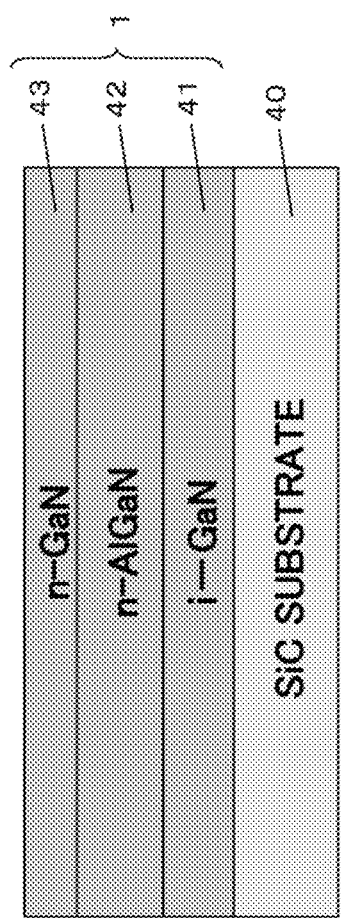
FIG. 2 is a schematic cross-sectional view illustrating a GaN-based semiconductor stacked structure included in the semiconductor device according to the first embodiment.

As depicted in FIG. 2, this MIS-type GaN-HEMT includes a GaN-based semiconductor stacked structure 1 wherein an i-GaN electron transit layer 41, an i-AlGaN layer (not illustrated), an n-AlGaN electron supply layer 42, and an n-GaN layer 43 are stacked in sequence on an SiC substrate (semiconductor substrate) 40. Note that the electron transit layer 41 is also referred to as a carrier transit layer. The electron supply layer 42 is also referred to as a carrier supply layer.

Figure 1:
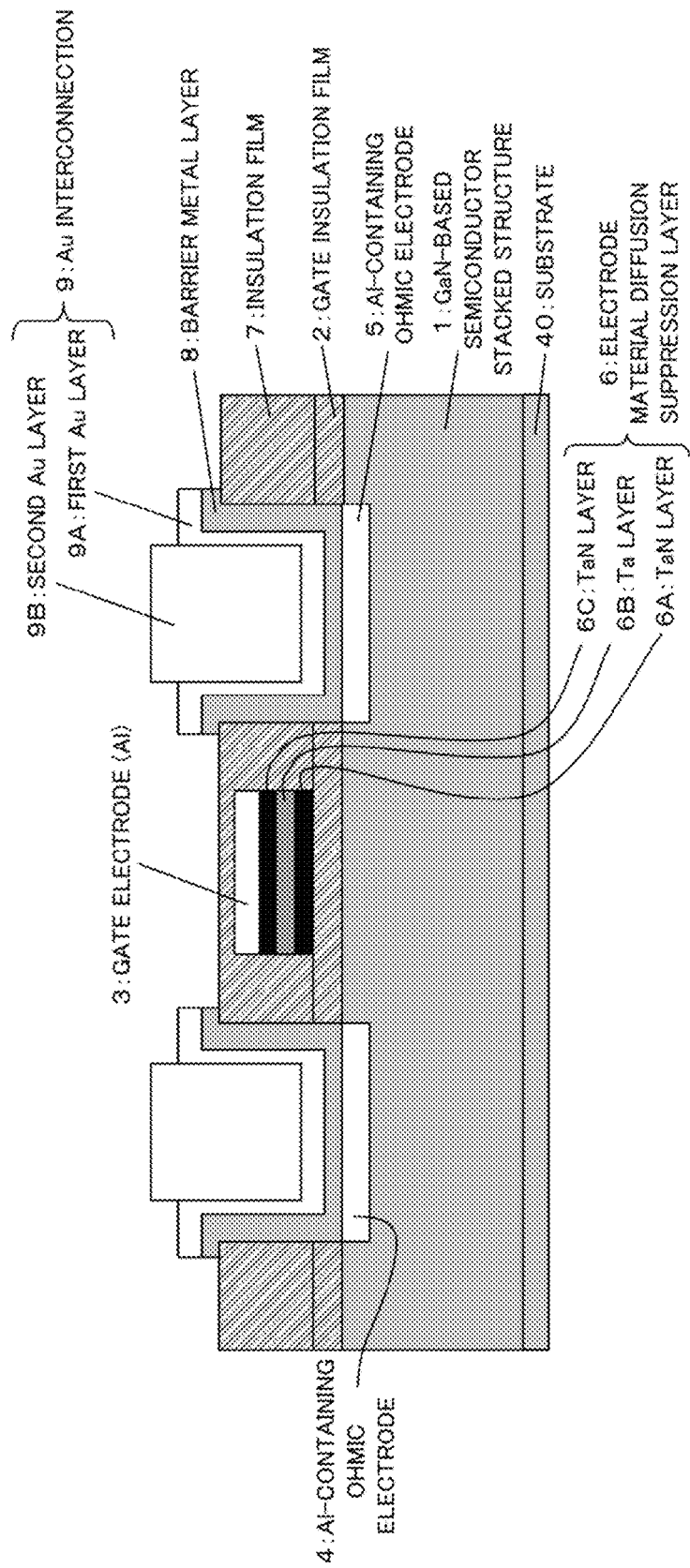
FIG. 1 is a schematic cross-sectional view illustrating the structure of the semiconductor device according to a first embodiment.

As depicted in FIG. 1, this MIS-type GaN-HEMT also includes a gate insulation film 2 on the GaN-based semiconductor stacked structure 1, and a gate electrode 3 is provided over the gate insulation film 2. Specifically, an electrode material diffusion suppression layer 6 is provided on the gate insulation film 2, and the gate electrode 3 is provided on the electrode material diffusion suppression layer 6. In other words, the electrode material diffusion suppression layer 6 is provided between the gate electrode 3 and the gate insulation film 2. The electrode material diffusion suppression layer 6 will be described in detail later.

The surfaces of the gate electrode 3, the electrode material diffusion suppression layer 6, and the gate insulation film 2 are covered with an insulation film 7. Note that the gate insulation film 2 is also referred to as a first insulation film. The insulation film 7 is also referred to as a second insulation film.

The gate electrode 3 is provided between a source electrode 4 and a drain electrode 5, which will be described later.

In this example, the gate insulation film 2 and the insulation film 7 are AlO films (e.g., $Al_2O_3$ films), for example. Furthermore, the gate electrode 3 is made from an Al layer, for example. In other words, the gate electrode material is aluminum which is a low-resistance material.

Note that this MIS-type GaN-HEMT may include a gate recess. For example, this MIS-type GaN-HEMT may include a gate recess which is defined by removing portions of the n-GaN layer 43 and the n-AlGaN electron supply layer 42 constituting the GaN-based semiconductor stacked structure 1.

Furthermore, this MIS-type GaN-HEMT includes a source electrode 4 and a drain electrode 5 provided on the GaN-based semiconductor stacked structure 1. In this embodiment, the n-GaN layer 43 constituting the GaN-based semiconductor stacked structure 1 is removed, and the source and drain electrodes 4 and 5 are provided on the n-AlGaN electron supply layer 42.

In this embodiment, the source and drain electrodes 4 and 5 are electrodes including an Al layer, e.g., electrodes wherein a Ti layer and an Al layer are stacked together.

Note that the source and drain electrodes 4 and 5 are also referred to as ohmic electrodes, ohmic electrodes including an Al layer, or Al-containing ohmic electrodes. Note that the ohmic electrodes including an Al layer or Al-containing ohmic electrodes may have any structure, as long as they include the Al layer on the top.

Furthermore, an Au interconnection 9, which is a low-resistance interconnection material, is provided on the Al-containing ohmic electrodes 4 and 5, i.e., the Al layer included in the Al-containing ohmic electrodes 4 and 5, via a barrier metal layer 8.

In this embodiment, the barrier metal layer 8 has a structure wherein a Ti layer and a Pt layer are stacked together. Note that the barrier metal layer 8 may be made of a Pt layer. Furthermore, an Au interconnection 9 has a structure wherein a first Au layer 9A and a second Au layer 9B are stacked together.

Although not illustrated, the surface is covered with an insulation film, e.g., an SiN film, here.

In this embodiment, the electrode material diffusion suppression layer 6 is provided between the gate electrode 3 and the gate insulation film 2, wherein this electrode material diffusion suppression layer 6 has a structure wherein a TaN layer (first TaN layer) 6A, a Ta layer 6B, and a TaN layer (second TaN layer) 6C are stacked in sequence.

Particularly, the first TaN layer 6A and the second TaN layer 6C preferably have a nitrogen content of greater than about 48% but no more than 52%. More preferably, the nitrogen content may be about 49% or greater but no more than 51%. This range of nitrogen content can suppress diffusion of the Al gate electrode material in a reliable manner.

Such a electrode material diffusion suppression layer 6 is provided for the following reasons.

As set forth above, it was found out that, when the gate insulation film 2 is provided between the GaN-based semiconductor stacked structure 1 and the gate electrode 3, the material of the gate electrode 3 diffuses into the gate insulation film 2 during a thermal treatment (an annealing process) during the manufacturing process, e.g., an annealing process (at 600° C. or lower, for example) for establishing an ohmic characteristic, which causes deterioration of the characteristics.

For suppressing the diffusion of the material of the gate electrode 3 into the gate insulation film 2, as depicted in FIG. 3, provision of a TaN layer 6A, which is a high-melting-point metal and a highly-stable metal, is considered, between the gate insulation film 2 and the gate electrode 3.

However, even with the TaN layer 6A provided between the gate electrode 3 and the gate insulation film 2, a threshold shift is induced during a device operation, i.e., a transistor operation, which causes deterioration of the characteristics, i.e., the transistor characteristics.

The reasons for this are considered as follows.

Figure 4A:
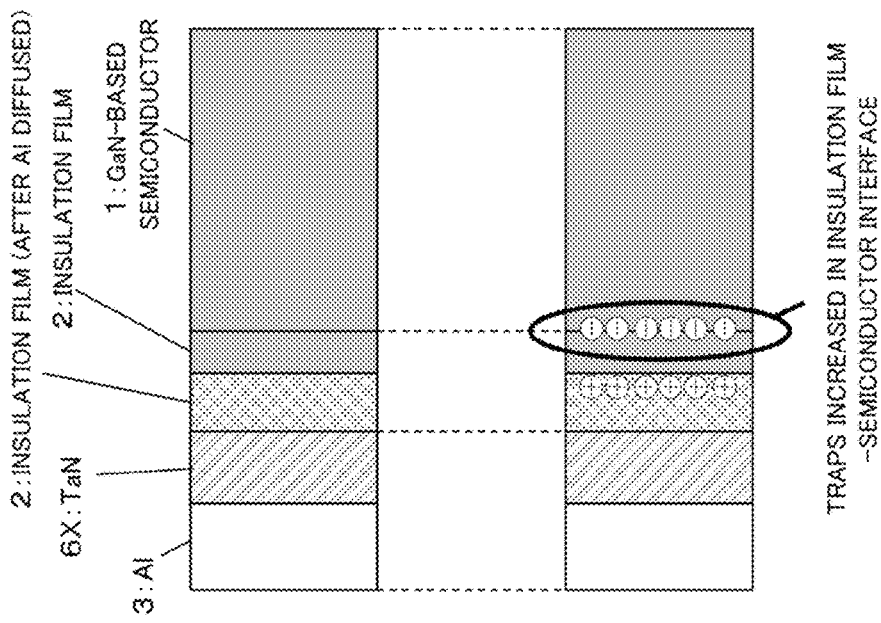
FIGS. 4A and 4B are schematic cross-sectional views illustrating the issues of the semiconductor device according to the first embodiment.
Figure 4B:
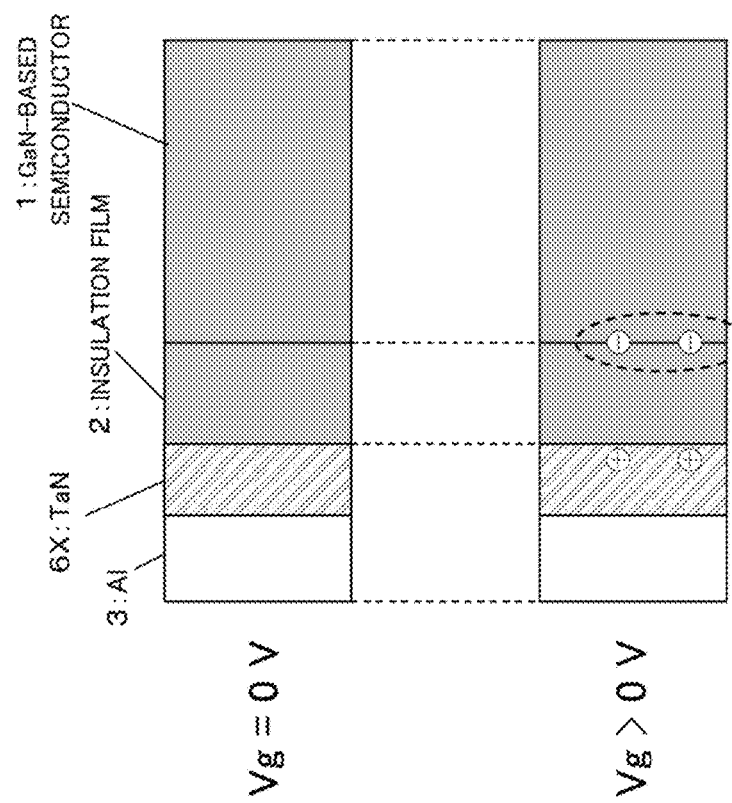

More specifically, by an annealing process for reducing the contact resistance of the ohmic electrodes 4 and 5 after formation of the gate electrode, or heat generation during a transistor operation, aluminum, i.e., the gate electrode material, diffuses into the gate insulation film 2 through diffusion paths formed along the boundaries of the grain present in the TaN layer 6A, as depicted in FIGS. 4A and 4B. This facilitates passage of positive charges from the gate electrode 3 through the gate insulation film 2 during a transistor operation, i.e., when the gate voltage Vg exceeds 0 V. As a result, electrons from the 2DEG region are easily trapped in the interface between the insulation film and the semiconductor. Stating differently, diffusion of the Al gate electrode material into the gate insulation film 2 facilitates trap of the electrons in the interface between the insulation film and the semiconductor, during a transistor operation, which induces a threshold shift and deteriorates the transistor characteristics. Note that FIG. 4A depicts the state before the thermal treatment (Vg=0 V, Vg>0 V), whereas FIG. 4B depicts the state after the thermal treatment (Vg=0 V, Vg>0 V).

Here, the single TaN layer 6A has two grain sizes, namely, about 8 nm and about 5 nm, for example. The TaN layer 6A having such a structure is not capable of suppressing diffusion of the Al gate electrode material due to a thermal treatment or heat generation described above.

On the other hand, the TaN layer formed on the Ta layer has three grain sizes, namely, about 8 nm, about 5 nm, and about 3 nm, for example.

Against this background, it was found out that a structure wherein a TaN layer, a Ta layer, and a TaN layer are stacked in sequence, could suppress diffusion of the Al gate electrode material into the gate insulation film 2, due to a thermal treatment or heat generation described above. More specifically, the structure having a TaN layer formed on a Ta layer has more complex diffusion paths within an Al gate electrode material, as compared to a structure with a single TaN layer 6A. Accordingly, such a structure can suppress diffusion of the Al gate electrode material into the gate insulation film 2, due to a thermal treatment or heat generation described above.

For the above reasons, in order to prevent deterioration of the characteristics, the electrode material diffusion suppression layer 6 has a structure wherein the TaN layer 6A, the Ta layer 6B, and the TaN layer 6C are stacked in sequence, as described above. This can suppress diffusion of the Al gate electrode material into the gate insulation film 2, due to a thermal treatment or heat generation described above. This can prevent electrons from the 2DEG region from being trapped in the interface between the insulation film and the semiconductor. As a result, a threshold shift during a transistor operation is prevented, which enables a stable transistor operation, thereby preventing deterioration of the transistor characteristics.

Particularly, for ensuring that the TaN layer 6C formed on the Ta layer 6B has three grain sizes to suppress diffusion of the Al gate electrode material in a reliable manner, preferably, the nitrogen content of the TaN layer 6C is controlled to be greater than about 48% but no more than 52%. For example, preferably, the nitrogen content of the TaN layer 6C is controlled during formation of the TaN layer 6C on the Ta layer 6B with sputtering, thereby adjusting the grain sizes. Furthermore, in order to enhance the diffusion suppression against the Al gate electrode material, the lower TaN layer 6A also preferably has a nitrogen content of greater than about 48% but no more than 52%.

Next, a method of manufacturing a semiconductor device (MIS-type GaN-HEMT) according to this embodiment will be explained with reference to FIGS. 5A to 5G and 6A to 6E.

Firstly, as depicted in FIG. 5A, a GaN-based semiconductor stacked structure 1 is formed on a semiconductor substrate 40.

In this example, an i-GaN electron transit layer 41, an i-AlGaN layer (not illustrated), an n-AlGaN electron supply layer 42, and an n-GaN layer 43 are grown, in sequence, on an SiC substrate 40, with a metal organic vapor phase epitaxy (MOVPE) technique, for example (see FIG. 2).

In this example, the i-GaN electron transit layer 41 has a thickness of about 3 µm, for example. The i-AlGaN layer has a thickness of about 5 nm, for example. The n-AlGaN electron supply layer 42 has a thickness of about 20 nm, and an Si dope concentration of about $5 \times 10^{18}$ cm$^{-3}$, for example. The n-GaN layer 43 has a thickness of about 10 nm, for example.

When a gate recess is provided, a resist having an opening at a region wherein a gate electrode is to be formed (hereinafter, gate electrode formation region) may be provided with photolithography, for example. Thereafter, the n-GaN layer 43 and the n-AlGaN electron supply layer 42 at the gate electrode formation region may be removed, with a dry etching using a fluorine-based gas, for example. In this case, all or a portion of the n-AlGaN electron supply layer 42 in the thickness direction may be removed. For example, about 1 nm of the n-AlGaN electron supply layer 42 may be remained. Only the n-GaN layer 43 may be removed, while keeping the n-AlGaN electron supply layer 42 remained.

Subsequently, as depicted in FIG. 5B, a gate insulation film 2 is formed on the GaN-based semiconductor stacked structure 1.

In this case, an AlO film 2 (e.g., $Al_2O_3$ film), as a gate insulation film, is formed on the GaN-based semiconductor stacked structure 1, with an atomic layer deposition (ALD) technique, for example.

Next, a TaN layer 6A, a Ta layer 6B, and a TaN layer 6C are stacked on the gate insulation film 2 to from an electrode material diffusion suppression layer 6.

In this embodiment, the TaN layer 6A, the Ta layer 6B, and the TaN layer 6C are stacked in sequence over the AlO film 2 as a gate insulation film, with sputtering, for example, to form the electrode material diffusion suppression layer 6. Note that the TaN layer 6A is referred to as a first TaN layer or a first metal layer, the Ta layer 6B is referred to as a second metal layer, and the TaN layer 6C is referred to as a second TaN layer or a third metal layer.

In this example, sputtering parameters for forming the Ta layer 6B and the TaN layers 6A and 6C are as follows: a degree of vacuum (pressure) of about 1.0 Pa and a power of about 1 kW, for example. The target-substrate distance (T/S) is about 200 mm, for example. The nitrogen contents of the TaN layers 6A and 6C are about 50%.

Next, aluminum, i.e., a gate electrode material, is deposited with sputtering, for example. In other words, an Al layer, which is to constitute a gate electrode 3, is formed on the electrode material diffusion suppression layer 6.

In this example, sputtering parameters for forming the Al layer 3 are as follows: a degree of vacuum (pressure) of about 0.7 Pa and a power of about 0.5 kW, for example. The target-substrate distance (T/S) is about 200 mm, for example.

Next, as depicted in FIG. 5C, a resist 15 is provided at the gate electrode formation region with photolithography, for example, and the TaN layer 6A, the Ta layer 6B, the TaN layer 6C, and the Al layer 3 being formed at a region other than the gate electrode formation region are removed, with a dry etching using a fluorine-based gas, for example. Thereby, the gate electrode 3 made of an Al layer is formed on the electrode material diffusion suppression layer 6. In other words, an MIS structure is formed.

Next, after removing the resist 15, as depicted in FIG. 5D, an AlO film 7 (e.g., $Al_2O_3$ film), as an insulation film, is formed on the AlO film 2 as a gate insulation film and the Al layer 3 as the gate electrode, with an ALD technique, for example. In other words, the insulation film 7 made of an AlO film is formed so as to cover the gate insulation film 2 and the gate electrode 3.

Next, as depicted in FIG. 5E, a resist 16 having openings at regions wherein ohmic electrodes are to be provided (hereinafter, ohmic electrode formation regions) is provided with photolithography, for example, and the gate insulation film 2 and the insulation film 7 at the ohmic electrode formation regions are removed with an ion milling technique using Ar gas, for example, as depicted in FIG. 5F. The particular method of etching the insulation films 2 and 7 is not limited to this, and other techniques, such as wet etching and dry etching, may be used.

Subsequently, the n-GaN layer 43 at the ohmic electrode formation regions is removed with a dry etching using a chlorine-based gas, for example. Although all of the n-GaN layer 43 at the ohmic electrode formation regions may be removed in this embodiment, some portion of the n-GaN layer 43 may be remained or some portion of the n-AlGaN electron supply layer 42 may be removed. The ohmic electrode formation regions represent a region wherein a source electrode is to be formed (hereinafter, source electrode formation region) and a region wherein a drain electrode is to be formed (hereinafter, drain electrode formation region). The ohmic electrode formation regions are also referred to as ohmic electrode sections, and the source electrode formation region and the drain electrode formation region are referred to as a source electrode section and a drain electrode section, respectively.

Subsequently, as depicted in FIG. 5G, Al-containing ohmic electrodes (source electrode and drain electrodes, in this embodiment) 4 and 5, made of Ti/Al, for example, are formed on the GaN-based semiconductor stacked structure 1, namely, the n-AlGaN electron supply layer 42, in this embodiment, with photolithography, and evaporation and lift-off techniques, for example. More specifically, a Ti layer and an Al layer are stacked in sequence on the n-AlGaN electron supply layer 42 to form ohmic electrodes including an Al layer (Al-containing ohmic electrodes) 4 and 5. Thereafter, the ohmic characteristic is established by an annealing process between about 400° C. to about 1000° C., such as at 550° C., for example, in nitrogen atmosphere, for example. If some portion of the n-GaN layer 43 has been remained during the above-described dry etching, the Al-containing ohmic electrodes 4 and 5 are formed on the n-GaN layer 43.

Next, as depicted in FIG. 6A, after forming a barrier metal layer 8 on the Al-containing ohmic electrodes 4 and 5, a first Au layer 9A that is to constitute an Au interconnection 9, is formed.

In this example, the barrier metal layer 8, made of a Ti layer and a Pt layer, and the first Au layer 9A are formed over the Al layer contained in the Al-containing ohmic electrodes 4 and 5, by stacking a Ti layer, a Pt layer, and a Au layer, in sequence, with sputtering, for example. The Ti layer, the Pt layer, and the Au layer are also referred to as first, second, and third metal layers, respectively.

In this example, sputtering parameters for forming the Ti layer, the Pt layer, and the Au layer are as follows: a degree of vacuum (pressure) of about 0.7 Pa and a power of about 0.5 kW, for example. The target-substrate distance (T/S) is about 200 mm, for example.

Next, as depicted in FIG. 6B, a resist 17 is provided over the ohmic electrodes 4 and 5 with photolithography, for example, and the barrier metal layer 8 and the first Au layer 9A, which are forming at a region other than regions above the ohmic electrodes 4 and 5, are removed with an ion milling technique using Ar gas, for example.

Next, after removing the resist 17, as depicted in FIG. 6C, a resist 18 having openings above the ohmic electrodes 4 and 5 is formed with photolithography, for example, and a second Au layer 9B is formed on the first Au layer 9A with a plating technique, for example, as depicted in FIG. 6D. Thereby, the Au interconnection 9 made of the first Au layer 9A and the second Au layer 9B, is formed on the barrier metal layer 8. More specifically, the barrier metal layer 8 is formed on the Al-containing ohmic electrodes 4 and 5, and the Au interconnection 9 is formed on the barrier metal layer 8.

Subsequently, after removing the resist 18, a SiN film (insulation film), which is not illustrated, is formed with a chemical vapor deposition (CVD) technique, for example.

In the above processes, as depicted in FIG. 6E, a semiconductor device (MIS-type GaN-HEMT) is manufactured.

As described above, the semiconductor device and the method of manufacturing the same according to this embodiment is advantageous in that diffusion of an electrode material can be suppressed, thereby achieving further improved characteristics.

Since diffusion of the material of the gate electrode 3 into the gate insulation film 2 due to a thermal treatment during the manufacturing process (e.g., an annealing process for establishing an ohmic characteristic), for example, is suppressed, improved characteristics can be obtained. Furthermore, since diffusion of the material of the gate electrode 3 into the gate insulation film 2 due to heat generation during a transistor operation, for example, is suppressed, improved characteristics can be obtained, thereby ensuring a higher reliability.

Second Embodiment

Next, a semiconductor device and a method of manufacturing the same according to a second embodiment will be described with reference to FIG. 7.

This embodiment has a different structure of the electrode material diffusion suppression layer 6, from that in the above-described first embodiment (see FIG. 1).

As depicted in FIG. 7, in this semiconductor device (MIS-type GaN-HEMT), the electrode material diffusion suppression layer 6 provided between the gate electrode 3 and the gate insulation film 2 further includes a Pt layer 6D stacked on the TaN layer 6C (second TaN layer). In FIG. 7, the same elements as those in the above-described first embodiment (see FIG. 1, for example) are referenced by the like reference symbols.

More specifically, this semiconductor device includes, between the gate electrode 3 and the gate insulation film 2, an electrode material diffusion suppression layer 6 structured by stacking a TaN layer 6A, a Ta layer 6B, and a TaN layer 6C, and a Pt layer 6D, in sequence, from the gate insulation film 2 side.

In this case, since the gate electrode 3 made of an Al layer is formed on the top Pt layer 6D in the electrode material diffusion suppression layer 6, the adhesion between the electrode material diffusion suppression layer 6 and the gate electrode 3 can be improved, as compared to the electrode material diffusion suppression layer 6 in the above-described first embodiment, thereby further improving the reliability. Furthermore, diffusion of the Al gate electrode material can be suppressed more effectively, as compared to the electrode material diffusion suppression layer 6 in the above-described first embodiment.

The semiconductor device (MIS-type GaN-HEMT) having the above structure can be manufactured as follows.

More specifically, during the step of forming an electrode material diffusion suppression layer 6 in the method of manufacturing a semiconductor device of the above-described first embodiment, a TaN layer 6A, a Ta layer 6B, a TaN layer 6C, and a Pt layer 6D may be stacked in sequence, on an AlO film 2 as a gate insulation film, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Pt layer 6D is referred to as a fourth metal layer.

In this example, sputtering parameters for forming the Ta layer 6B and the TaN layers 6A and 6C are similar to those in the above-described first embodiment. In addition, sputtering parameters for forming the Pt layer 6D are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described first embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the first embodiment as described above.

Third Embodiment

Next, a semiconductor device and a method of manufacturing the same according to a third embodiment will be described with reference to FIG. 8.

This embodiment has a different structure of the electrode material diffusion suppression layer 6, from that in the above-described first embodiment (see FIG. 1).

As depicted in FIG. 8, in this semiconductor device (MIS-type GaN-HEMT), the electrode material diffusion suppression layer 6 provided between the gate electrode 3 and the gate insulation film 2 further includes an Ag layer 6E stacked on the TaN layer 6C (second TaN layer). In FIG. 8, the same elements as those in the above-described first embodiment (see FIG. 1, for example) are referenced by the like reference symbols.

More specifically, this semiconductor device includes, between the gate electrode 3 and the gate insulation film 2, an electrode material diffusion suppression layer 6 structured by stacking a TaN layer 6A, a Ta layer 6B, and a TaN layer 6C, and an Ag layer 6E, in sequence, from the gate insulation film 2 side.

In this case, since the gate electrode 3 made of an Al layer is formed on the top Ag layer 6E in the electrode material diffusion suppression layer 6, the adhesion between the electrode material diffusion suppression layer 6 and the gate electrode 3 can be improved, as compared to the electrode material diffusion suppression layer 6 in the above-described first embodiment, thereby further improving the reliability. Furthermore, diffusion of the Al gate electrode material can be suppressed more effectively, as compared to the electrode material diffusion suppression layer 6 in the above-described first embodiment. Furthermore, the manufacturing cost can be reduced, as compared to the electrode material diffusion suppression layer 6 in the above-described second embodiment, without reducing the level of the diffusion suppression against the Al gate electrode material.

The semiconductor device (MIS-type GaN-HEMT) having the above structure can be manufactured as follows.

More specifically, during the step of forming an electrode material diffusion suppression layer 6 in the method of manufacturing a semiconductor device of the above-described first embodiment, a TaN layer 6A, a Ta layer 6B, a TaN layer 6C, and an Ag layer 6E may be stacked in sequence, over an AlO film 2 as agate insulation film, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Ag layer 6E is referred to as a fourth metal layer.

In this example, sputtering parameters for forming the Ta layer 6B and the TaN layers 6A and 6C are similar to those in the above-described first embodiment. In addition, sputtering parameters for forming the Ag layer 6E are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described first embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the first embodiment as described above.

Fourth Embodiment

Next, a semiconductor device and a method of manufacturing the same according to a fourth embodiment will be described with reference to FIG. 9.

This embodiment has a different structure of the electrode material diffusion suppression layer 6, from that in the above-described first embodiment (see FIG. 1).

Figure 9:
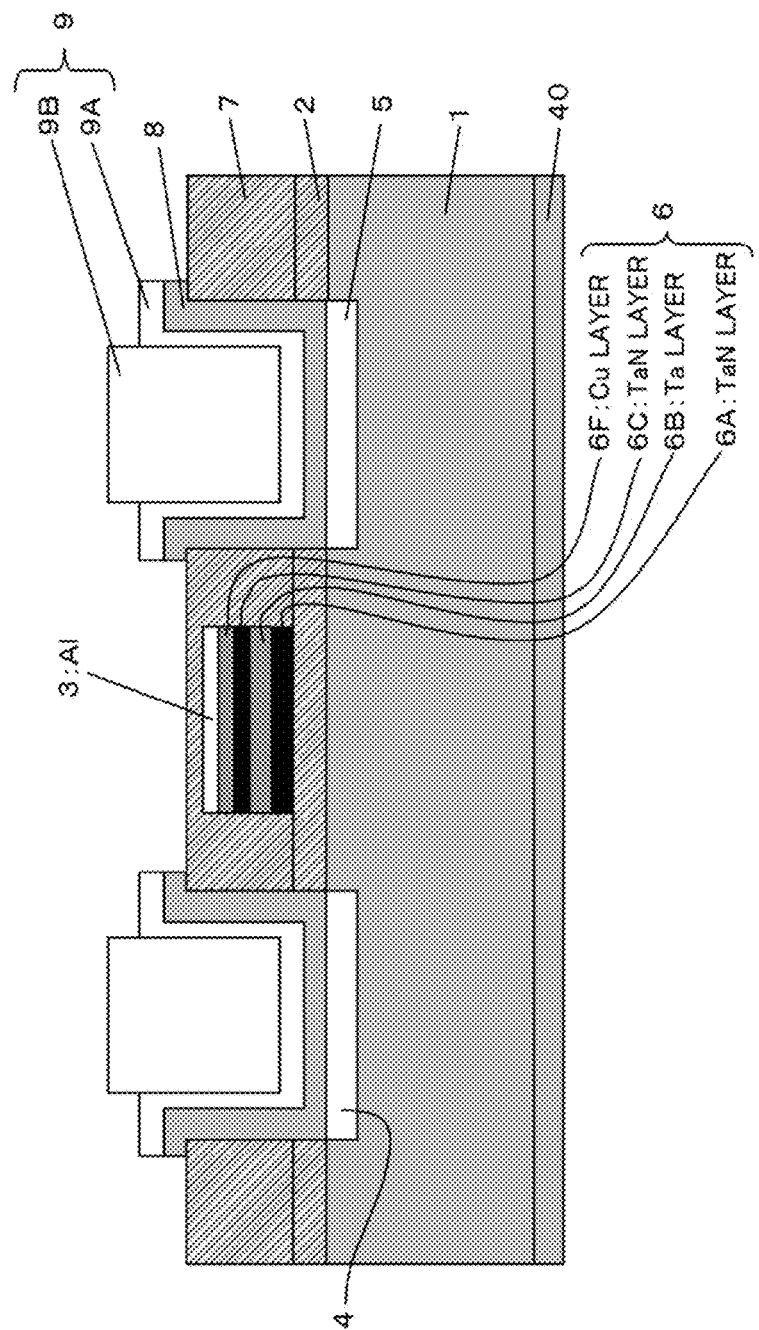
FIG. 9 is a schematic cross-sectional view illustrating the structure of a semiconductor device according to a fourth embodiment.

As depicted in FIG. 9, in this semiconductor device (MIS-type GaN-HEMT), the electrode material diffusion suppression layer 6 provided between the gate electrode 3 and the gate insulation film 2 further includes a Cu layer 6F stacked on the TaN layer 6C (second TaN layer). In FIG. 9, the same elements as those in the above-described first embodiment (see FIG. 1, for example) are referenced by the like reference symbols.

More specifically, this semiconductor device includes, between the gate electrode 3 and the gate insulation film 2, an electrode material diffusion suppression layer 6 structured by stacking a TaN layer 6A, a Ta layer 6B, and a TaN layer 6C, and a Cu layer 6F, in sequence, from the gate insulation film 2 side.

In this case, since the gate electrode 3 made of an Al layer is formed on the top Cu layer 6F in the electrode material diffusion suppression layer 6, the adhesion between the electrode material diffusion suppression layer 6 and the gate electrode 3 can be improved, as compared to the electrode material diffusion suppression layer 6 in the above-described first embodiment, thereby further improving the reliability. Furthermore, diffusion of the Al gate electrode material can be suppressed more effectively, as compared to the electrode material diffusion suppression layer 6 in the above-described first embodiment. Furthermore, the manufacturing cost can be reduced, as compared to the electrode material diffusion suppression layer 6 in the above-described second and third embodiments, without reducing the adhesion. Furthermore, the manufacturing cost can be reduced, as compared to the electrode material diffusion suppression layer 6 in the above-described third embodiment, without reducing the level of the diffusion suppression against the Al gate electrode material.

The semiconductor device (MIS-type GaN-HEMT) having the above structure can be manufactured as follows.

More specifically, during the step of forming an electrode material diffusion suppression layer 6 in the method of manufacturing a semiconductor device of the above-described first embodiment, a TaN layer 6A, a Ta layer 6B, a TaN layer 6C, and a Cu layer 6F may be stacked in sequence, over an AlO film 2 as a gate insulation film, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, the Cu layer 6F is referred to as a fourth metal layer.

In this example, sputtering parameters for forming the Ta layer 6B and the TaN layers 6A and 6C are similar to those in the above-described first embodiment. In addition, sputtering parameters for forming the Cu layer 6F are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described first embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the first embodiment as described above.

Fifth Embodiment

Next, a semiconductor device and a method of manufacturing the same according to a fifth embodiment will be described with reference to FIG. 10.

This embodiment has a different structure of the electrode material diffusion suppression layer 6, from that in the above-described first embodiment (see FIG. 1).

Figure 10:
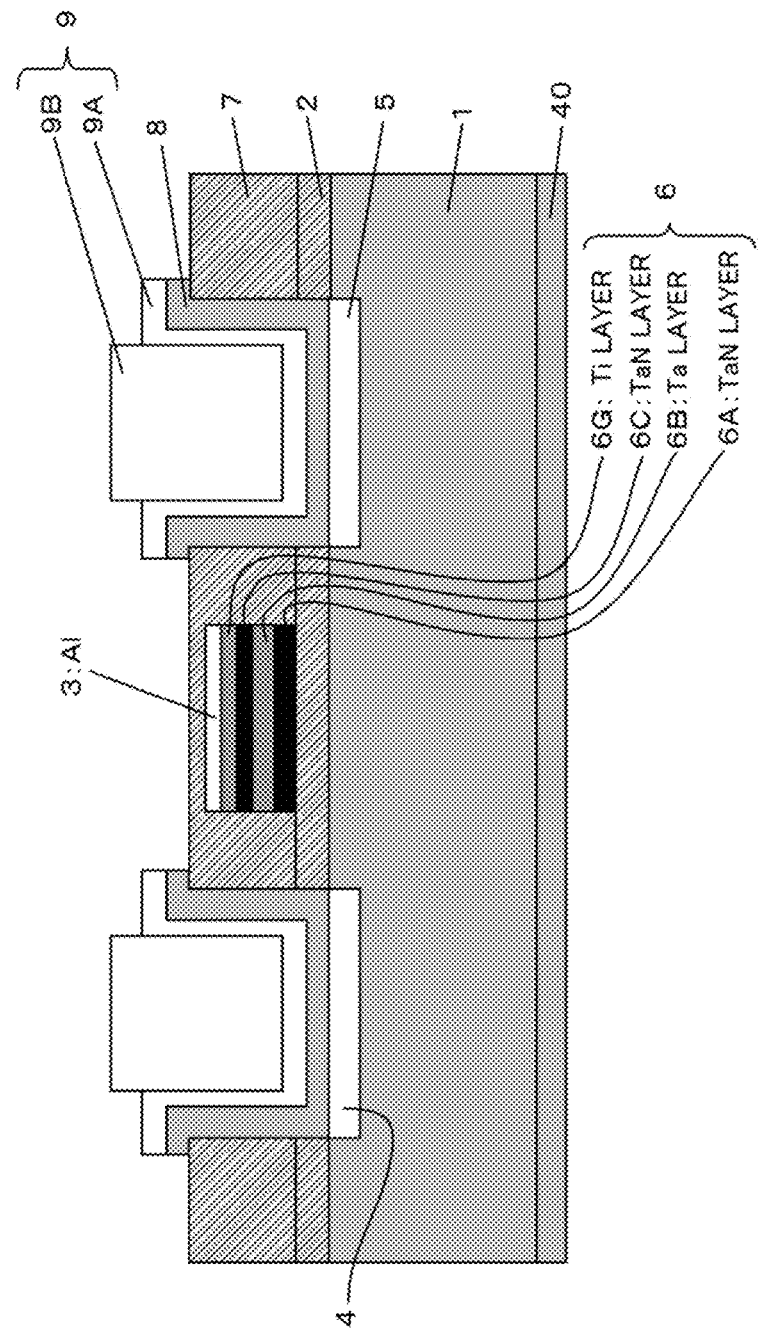
FIG. 10 is a schematic cross-sectional view illustrating the structure of a semiconductor device according to a fifth embodiment.

As depicted in FIG. 10, in this semiconductor device (MIS-type GaN-HEMT), the electrode material diffusion suppression layer 6 provided between the gate electrode 3 and the gate insulation film 2 further includes a Ti layer 6G stacked on the TaN layer 6C (second TaN layer). In FIG. 10, the same elements as those in the above-described first embodiment (see FIG. 1, for example) are referenced by the like reference symbols.

More specifically, this semiconductor device includes, between the gate electrode 3 and the gate insulation film 2, an electrode material diffusion suppression layer 6 structured by stacking a TaN layer 6A, a Ta layer 6B, and a TaN layer 6C, and a Ti layer 6G, in sequence, from the gate insulation film 2 side.

In this case, since the gate electrode 3 made of an Al layer is formed on the top Ti layer 6G in the electrode material diffusion suppression layer 6, the adhesion between the electrode material diffusion suppression layer 6 and the gate electrode 3 can be improved, as compared to the electrode material diffusion suppression layer 6 in the above-described first embodiment, thereby further improving the reliability. Furthermore, diffusion of the Al gate electrode material can be suppressed more effectively, as compared to the electrode material diffusion suppression layer 6 in the above-described first embodiment. Furthermore, the manufacturing cost can be reduced, as compared to the electrode material diffusion suppression layer 6 in the above-described second, third, and fourth embodiments, without reducing the adhesion. Furthermore, the manufacturing cost can be reduced, as compared to the electrode material diffusion suppression layer 6 in the above-described second embodiment, without reducing the level of the diffusion suppression against the Al gate electrode material.

The semiconductor device (MIS-type GaN-HEMT) having the above structure can be manufactured as follows.

More specifically, during the step of forming an electrode material diffusion suppression layer 6 in the method of manufacturing a semiconductor device of the above-described first embodiment, a TaN layer 6A, a Ta layer 6B, a TaN layer 6C, and a Ti layer 6G may be stacked in sequence, over an AlO film 2 as a gate insulation film, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Ti layer 6G is referred to as a fourth metal layer.

In this example, sputtering parameters for forming the Ta layer 6B and the TaN layers 6A and 6C are similar to those in the above-described first embodiment. In addition, sputtering parameters for forming the Ti layer 6G are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described first embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the first embodiment as described above.

Sixth Embodiment

A semiconductor device and a method of manufacturing the same according to a sixth embodiment will be described with reference to FIGS. 11 to 16E.

Figure 11:
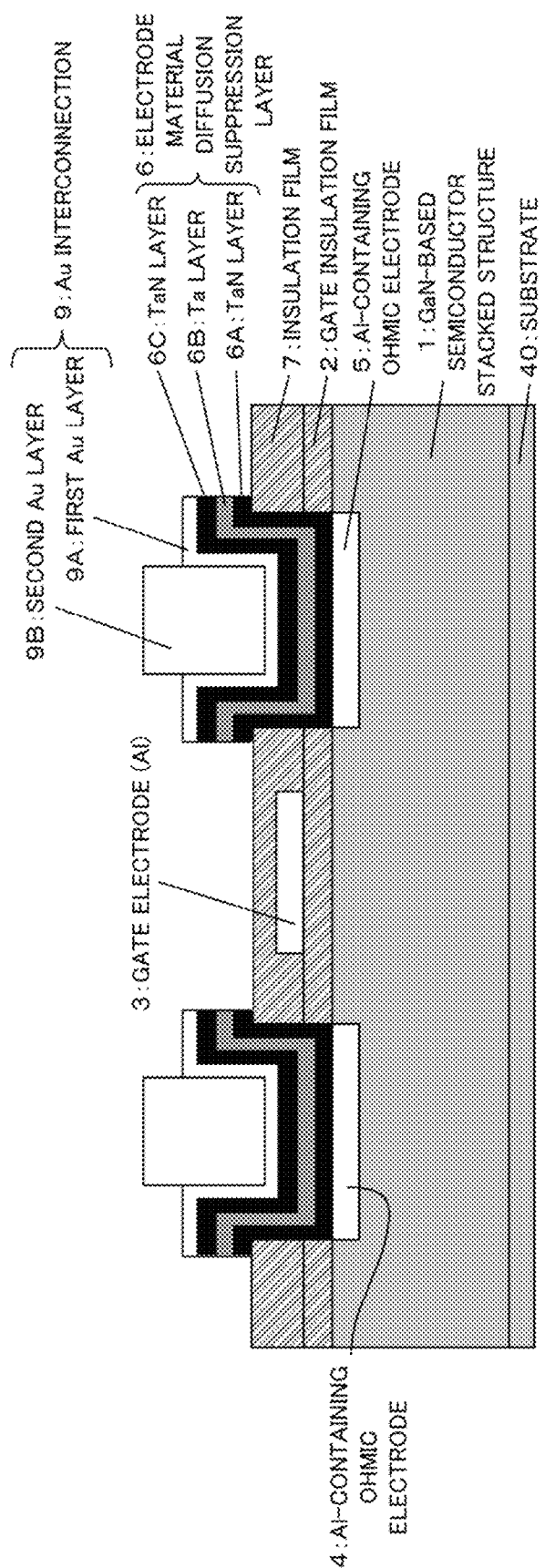
FIG. 11 is a schematic cross-sectional view illustrating the structure of a semiconductor device according to a sixth embodiment.

In the above-described first embodiment (see FIG. 1), the electrode material diffusion suppression layer 6 is provided between the gate electrode 3 and the gate insulation film 2. In contrast, the present embodiment is different in that the electrode material diffusion suppression layer 6 is provided between the Al layer included in the ohmic electrodes 4 and 5 and the Au interconnection 9, as depicted in FIG. 11. In FIG. 11, the same elements as those in the above-described first embodiment (see FIG. 1, for example) are referenced by the like reference symbols.

More specifically, unlike the above-described first embodiment (see FIG. 1) wherein the electrode material diffusion suppression layer 6 is provided between the gate electrode 3 and the gate insulation film 2, in this embodiment, in place of the barrier metal layer 8, the electrode material diffusion suppression layer 6 having the same stacked structure as that in the above-described first embodiment is provided between the Al layer included in the ohmic electrodes 4 and 5 and the Au interconnection 9.

In this semiconductor device (MIS-type GaN-HEMT), the electrode material diffusion suppression layer 6 is provided between the Al layer included in the ohmic electrodes 4 and 5 and the Au interconnection 9, wherein the electrode material diffusion suppression layer 6 has a structure wherein a TaN layer 6A (first TaN layer), a Ta layer 6B, and a TaN layer 6C (second TaN layer) are stacked in sequence. The electrode material diffusion suppression layer 6 is a layer for suppressing diffusion of aluminum (Al) which is the material of the ohmic electrodes 4 and 5. The electrode material diffusion suppression layer 6 not only suppresses diffusion of aluminum which is the material of the ohmic electrodes 4 and 5, but also suppresses diffusion of gold (Au) which is the material of the interconnection 9. Accordingly, the electrode material diffusion suppression layer 6 also functions as an interconnection material diffusion suppression layer.

Particularly, the first TaN layer 6A and the second TaN layer 6C preferably have a nitrogen content of greater than about 48% but no more than 52%. More preferably, the nitrogen content may be about 49% or greater but no more than 51%. This range of nitrogen content can suppress diffusion of the electrode and interconnection materials in a reliable manner.

Such a electrode material diffusion suppression layer 6 is provided for the following reasons.

Thermal degradation accelerated tests (at 450° C., 450° C. anneal tests) were conducted on a Pt layer (with a thickness of about 200 nm); a Ta layer (TaN layer of a nitrogen content of about 0%, with a thickness of about 200 nm); a TaN layer of a nitrogen content of about 44% (with a thickness of about 200 nm); a TaN layer of a nitrogen content of about 50% (with a thickness of about 200 nm); and a TaN layer of a nitrogen content of about 50% (with a thickness of about 100 nm), as candidates for an electrode material diffusion suppression layer, to accelerate their degradation.

In the tests, thermal characteristics of the candidate electrode material diffusion suppression layers were evaluated, considering higher temperatures exceeding about 300° C., which may be experienced in a die bonding step for bonding a semiconductor chip to a base with a die bonding material, such as Au—Sn, for example.

Then, the time durations until the electrode material diffusion suppression layer degrades and an Au—Al compound is formed (in FIGS. 12A to 12D, time durations from the state in FIG. 12A to the state in FIG. 12B; reaction times) were measured for each layer.

Figure 12D:
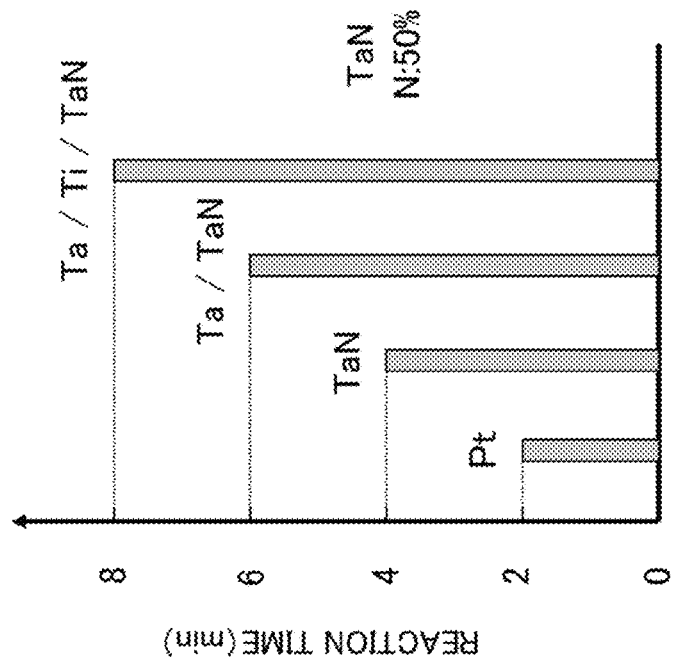
Figures 12A, 12B:
Figure 12C:
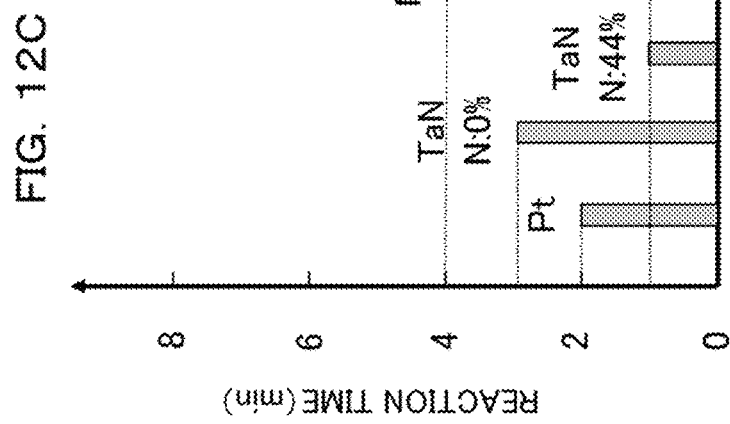

As depicted in FIG. 12C, the results indicated that the Ta layer had a longer reaction time, i.e., provided a superior diffusion suppression against the electrode and interconnection materials (thermal stability, barrier property), as compared to the Pt layer. In contrast, the TaN layer of a nitrogen content of about 44% had a shorter reaction time, i.e., provided an inferior diffusion suppression against the electrode and interconnection materials, as compared to the Pt layer. On the other hand, the TaN layer of a nitrogen content of about 50% (with a thickness of about 200 nm) had a longer reaction time, i.e., provided a superior diffusion suppression against the electrode and interconnection materials, as compared to the Pt layer and the Ta layer. In short, the diffusion suppression against the electrode and interconnection materials of TaN layers declines with an increase in the nitrogen content, up to the nitrogen content of about 44%. However, TaN layers start to exhibit a superior diffusion suppression against the electrode and interconnection materials to a Pt layer and a Ta layer when a nitrogen content reaches near about 50%, i.e., the nitrogen content is greater than about 48% but no more than 52%. Here, a longer reaction time and a superior diffusion suppression against the electrode and interconnection materials mean that transistors are resistant to an increase in the resistance and deterioration of the transistor characteristics.

Figure 13:
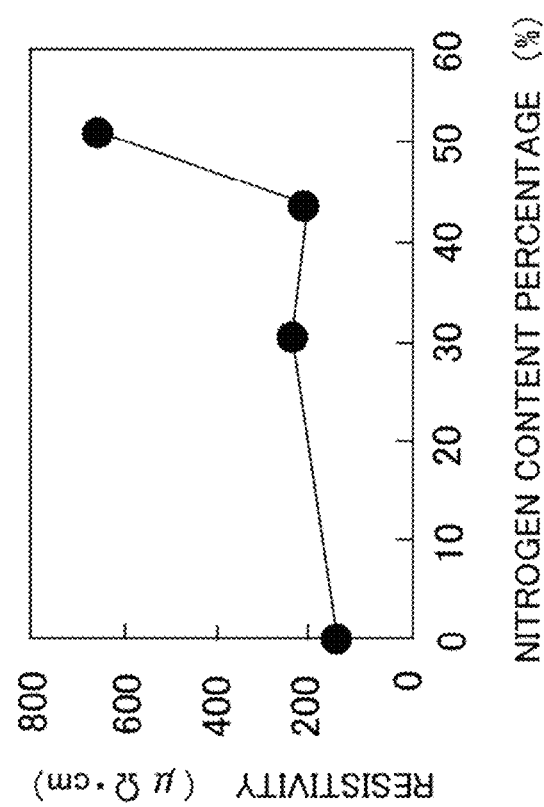
FIG. 13 is a graph illustrating the issues of the semiconductor device according to the sixth embodiment.

The change in the resistivity with the nitrogen content in a TaN layer was then studied, which revealed that a TaN layer of a nitrogen content near about 50% provides an excellent diffusion suppression against the electrode and interconnection materials, but has a higher resistivity, as depicted in FIG. 13. Here, a higher resistivity means increased heat generation and power consumption during a transistor operation, meaning reduced transistor characteristics.

Thus, a thermal degradation accelerated test was conducted on a TaN layer having a halved thickness for reducing the resistivity (nitrogen content of about 50%; with a thickness of about 100 nm). The result indicated that this TaN layer had a shorter reaction time, i.e., provided an inferior diffusion suppression against the electrode and interconnection materials, as compared to the Pt layer, as depicted in FIG. 12C.

As described above, it is difficult to suppress an inter-diffusion of Al and Au and prevent an increase in the resistance, while preventing an increase in the resistivity of these layers and preventing increased heat generation and power consumption during a transistor operation, thereby further improving the characteristics and achieving a more reliable transistor. In other words, it is difficult to achieve an electrode material diffusion suppression layer having an excellent diffusion suppression against the electrode and interconnection materials comparable to that of a TaN layer of a nitrogen content of about 50% or higher (with a thickness of about 200 nm), and has a lower resistivity, with a single electrode material diffusion suppression layer.

Thus, thermal degradation accelerated tests (at 450° C.) were again conducted on electrode material diffusion suppression layers: wherein a Ta layer (with a thickness of about 100 nm) and a TaN layer of a nitrogen content of about of 50% (with a thickness of about 100 nm) were stacked in sequence (Ta/TaN structure); and wherein a Ta layer, a Ti layer, a TaN layer of a nitrogen content of about of 50% were stacked in sequence such that the total thickness became about 200 nm (Ta/Ti/TaN structure).

Then, the time durations until the electrode material diffusion suppression layer degrades and an Au—Al compound is formed (in FIGS. 12A to 12D, time durations from the state in FIG. 12A to the state in FIG. 12B; reaction times) were measured for each layer.

Figure 14:
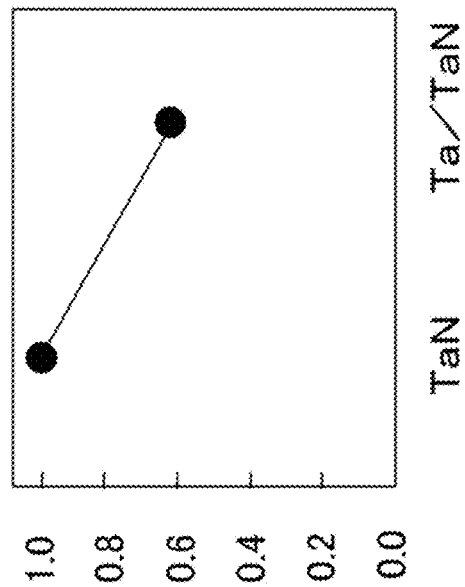
FIG. 14 is a graph illustrating the issues of the semiconductor device according to the sixth embodiment.

As depicted in FIG. 12D, the results indicated that the electrode material diffusion suppression layer with a Ta/TaN structure, wherein a Ta layer with a lower resistivity and a TaN layer with an excellent diffusion suppression against the electrode and interconnection materials (of a nitrogen content of about 50%; with a thickness of about 100 nm) were combined, had a longer reaction time, i.e., a superior diffusion suppression against the electrode and interconnection materials, as compared to a single Pt layer (with a thickness of about 200 nm) or TaN (of a nitrogen content of about 50%; with a thickness of about 200 nm). Furthermore, as depicted in FIG. 14, it was found that the electrode material diffusion suppression layer with a Ta/TaN structure had the resistivity of about 60% of that of the electrode material diffusion suppression layer using a TaN (of a nitrogen content of about 50%; with a thickness of about 200 nm). More specifically, when assuming that the resistivity of TaN (of a nitrogen content of about 50%; with a thickness of about 200 nm) is 1.0, the resistivity of the electrode material diffusion suppression layer having a Ta/TaN structure could be reduced to about 0.6.

Furthermore, it was found that an electrode material diffusion suppression layer having a Ta/Ti/TaN structure had a longer reaction time, i.e., a superior diffusion suppression against the electrode and interconnection materials, as compared with an electrode material diffusion suppression layer having a Ta/TaN structure. In other words, by providing a Ti layer (adhesion layer) between a Ta layer and a TaN layer, the adhesion between the Ta layer and the TaN layer can be improved, thereby enhancing the diffusion suppression against the electrode and interconnection materials.

However, an electrode material diffusion suppression layer having a Ta/TaN structure degrades and forms an Au—Al compound in six minutes when heated at 450° C. This results in an increased resistance, and deteriorates the transistor characteristics.

For further improvement of the transistor characteristics, a GaN-based transistor is required to be operated under a high current density, and accordingly an electrode material diffusion suppression layer with an even higher diffusion suppression against the electrode and interconnection materials is required.

Against this background, as described above, an electrode material diffusion suppression layer 6 has a structure wherein a TaN layer 6A, a Ta layer 6B, and a TaN layer 6C are stacked in sequence, by additionally including a TaN layer in the above-described Ta/TaN structure. Although the electrode material diffusion suppression layer 6 is configured such that the thickness, i.e., the total thicknesses of the TaN layer 6A, the Ta layer 6B, and the TaN layer 6C becomes about 200 nm in this embodiment, this is not limiting. With this structure, an electrode material diffusion suppression layer 6 exhibiting a higher diffusion suppression against the electrode and interconnection materials and having a lower resistivity can be achieved. In other words, inter-diffusion of Al and Au is suppressed and increase in the resistance is prevented, while preventing an increase in the resistivity of the electrode material diffusion suppression layer 6 and preventing increased heat generation and power consumption during a transistor operation, thereby further improving the characteristics and achieving a more reliable transistor.

The other structures are similar to those in the above-described first embodiment, and descriptions thereof will be omitted.

Hereinafter, a method of manufacturing a semiconductor device (MIS-type GaN-HEMT) according to this embodiment will be explained with reference to FIGS. 15A to 15F and 16A to 16E.

Figure 15A:
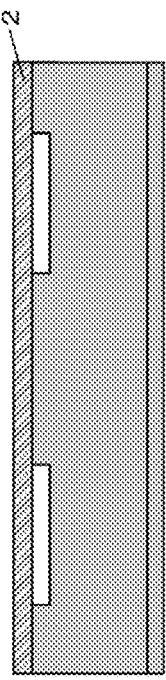
FIGS. 15A to 15F are schematic cross-sectional views illustrating a method of manufacturing a semiconductor device according to the sixth embodiment.

Firstly, like the above-described first embodiment, as depicted in FIG. 15A, a GaN-based semiconductor stacked structure 1 is formed on a semiconductor substrate 40.

Next, like the above-described first embodiment, a resist having openings at the ohmic electrode formation regions is provided with photolithography, for example, and the GaN-based semiconductor stacked structure 1, namely, the n-GaN layer 43, in this example, at the ohmic electrode formation regions is removed with a dry etching using a chorine-based gas, for example.

Figure 15B:
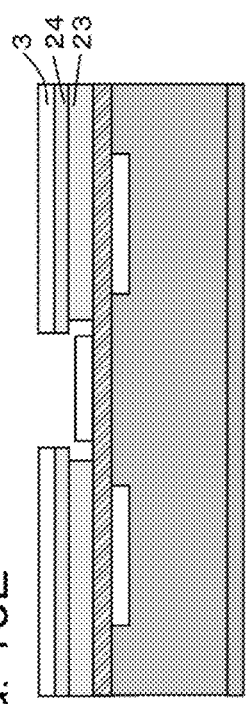
Figure 15C:
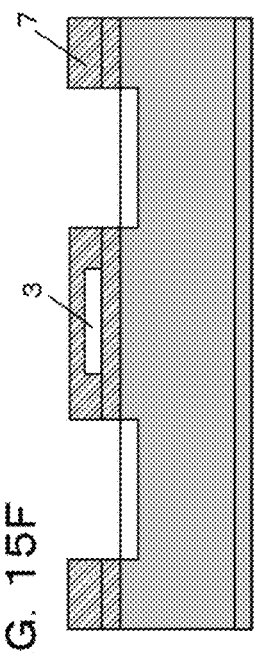

Subsequently, like the above-described first embodiment, as depicted in FIGS. 15B and 15C, Al-containing ohmic electrodes (source electrode and drain electrodes, in this embodiment) 4 and 5, made of Ti/Al, for example, are formed on the GaN-based semiconductor stacked structure 1, namely, the n-AlGaN electron supply layer 42, in this embodiment, with photolithography, and evaporation and lift-off techniques, for example. More specifically, a first resist film 20 and a second resist film 21 having openings at the ohmic electrode formation regions are formed over the n-AlGaN electron supply layer 42 with photolithography, for example. Next, a Ti layer and an Al layer are formed, in sequence, over the entire surface, i.e., on the surface of the second resist film 21 and in the openings with evaporation, for example. Note that the Ti layer and the Al layer are correctively denoted by the reference numeral 22 in FIG. 15B. The Ti layer and the Al layer formed in the openings are remained after removing the first resist film 20 and second resist film 21, and the Al-containing ohmic electrodes 4 and 5 made of Ti/Al, for example, are formed. Thereafter, the ohmic characteristic is established by an annealing process between about 400° C. to about 1000° C., such as at 550° C., for example, in nitrogen atmosphere, for example.

As in the above-described first embodiment, when a gate recess is provided, a resist having an opening at a region wherein a gate electrode is to be formed (hereinafter, gate electrode formation region) may be provided with photolithography, for example. Thereafter, the n-GaN layer 43 and the n-AlGaN electron supply layer 42 at the gate electrode formation region may be removed, with a dry etching using a fluorine-based gas, for example.

Figure 15D:
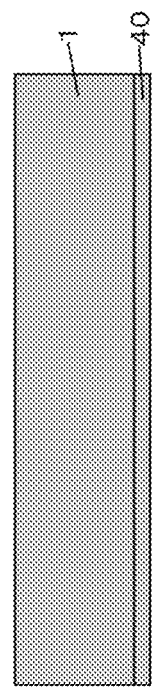

Next, like the above-described first embodiment, as depicted in FIG. 15D, an AlO film (e.g., $Al_2O_3$ film) 2, as a gate insulation film, is formed on the GaN-based semiconductor stacked structure 1 with an ALD technique, for example.

Figure 15E:
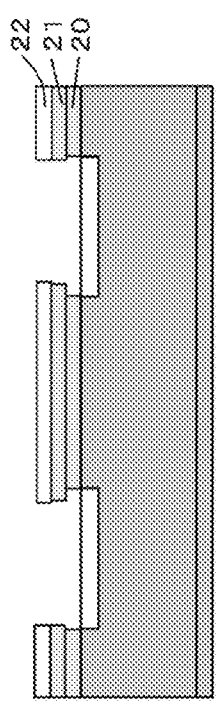
Figure 15F:
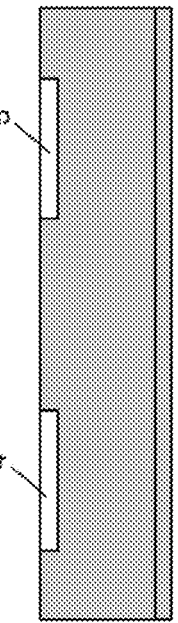

Next, as depicted in FIGS. 15E and 15F, a gate electrode 3 made of an Al layer, for example, is formed on the AlO film 2, as a gate insulation film, with photolithography, and evaporation and lift-off techniques, for example. More specifically, a first resist film 23 and a second resist film 24 having an opening at the gate electrode formation region are formed over the AlO film 2 with photolithography, for example. Next, aluminum, which is a gate electrode material, is deposited over the entire surface, i.e., on the surface of the second resist film 24 and in the opening with evaporation, for example, thereby an Al layer 3 is formed. Only the Al layer 3 formed in the opening is remained after removing the first resist film 23 and the second resist film 24, and the gate electrode 3 made of an Al layer is formed. In the above processes, an MIS structure is formed.

Next, like the above-described first embodiment, again, as depicted in FIG. 15F, an AlO film 7 (e.g., $Al_2O_3$ film), as an insulation film, is formed on the AlO film 2 as a gate insulation film and the Al layer 3 as the gate electrode, with an ALD technique, for example.

Next, like the above-described first embodiment, a resist having openings at the ohmic electrode formation regions is provided with photolithography, for example, and the gate insulation film 2 and the insulation film 7 at the ohmic electrode formation regions are removed with an ion milling technique using Ar gas, for example.

Next, as depicted in FIG. 16A, a TaN layer 6A, a Ta layer 6B, and a TaN layer 6C are stacked in sequence over the Al-containing ohmic electrodes 4 and 5, namely, over the Al layer included in the Al-containing ohmic electrodes 4 and 5, in this example, with sputtering, for example. In the above processes, the electrode material diffusion suppression layer 6 structured by stacking the TaN layer 6A, the Ta layer 6B, and the TaN layer 6C, in sequence, is formed. Note that the TaN layer 6A is referred to as a first TaN layer or a first metal layer, the Ta layer 6B is referred to as a second metal layer, and the TaN layer 6C is referred to as second TaN layer or a third metal layer.

In this example, sputtering parameters for forming the Ta layer 6B and the TaN layers 6A and 6C are as follows: a degree of vacuum (pressure) of about 1.0 Pa and a power of about 1 kW, for example. The target-substrate distance (T/S) is about 200 mm, for example. The nitrogen contents of the TaN layers 6A and 6C are about 50%.

Next, a first Au layer 9A that is to constitute an Au interconnection 9, is formed on the electrode material diffusion suppression layer 6. In this example, the first Au layer 9A is formed on the TaN layer 6C included in the electrode material diffusion suppression layer 6 with sputtering, for example.

In this example, sputtering parameters for forming the first Au layer 9A are as follows: a degree of vacuum (pressure) of about 0.8 Pa and a power of about 0.8 kW, for example. The target-substrate distance (T/S) is about 200 mm, for example.

Next, as depicted in FIG. 16B, a resist 25 is provided over the ohmic electrodes 4 and 5 with photolithography, for example, and the TaN layer 6A, the Ta layer 6B, the TaN layer 6C, and the first Au layer 9A, which are forming at a region other than regions above the ohmic electrodes 4 and 5, are removed with an ion milling technique using Ar gas, for example.

Next, like the above-described first embodiment, as depicted in FIG. 16C, a resist 26 having openings above the ohmic electrodes 4 and 5 is formed with photolithography, for example, and a second Au layer 9B is formed on the first Au layer 9A with a plating technique, for example, as depicted in FIG. 16D. Thereby, the Au interconnection 9 made of the first Au layer 9A and the second Au layer 9B is formed on the electrode material diffusion suppression layer 6. More specifically, the electrode material diffusion suppression layer 6 is formed on the Al-containing ohmic electrodes 4 and 5, and the Au interconnection 9 is formed on the electrode material diffusion suppression layer 6.

Subsequently, like the above-described first embodiment, a SiN film (insulation film), which is not illustrated, is formed over the entire surface with a CVD technique, for example.

In the above processes, as depicted in FIG. 16E, a semiconductor device (MIS-type GaN-HEMT) is manufactured.

The other details are similar to those in the above-described first embodiment, and descriptions thereof will be omitted.

As described above, the semiconductor device and the method of manufacturing the same according to this embodiment is advantageous in that diffusion of an electrode material can be suppressed, thereby achieving further improved characteristics.

In other words, inter-diffusion of Al and Au is suppressed between the Al layer included in the ohmic electrodes 4 and 5 and the Au interconnection 9 and increase in the resistance is prevented, while preventing increase in the resistivity of the electrode material diffusion suppression layer 6 and preventing increased heat generation and power consumption during a transistor operation, thereby further improving the characteristics. Furthermore, since inter-diffusion of Al and Au due to heat generation during a transistor operation is suppressed, improved characteristics can be obtained, thereby ensuring a higher reliability.

Seventh Embodiment

Next, a semiconductor device and a method of manufacturing the same according to a seventh embodiment will be described with reference to FIG. 17.

This embodiment has a different structure of the electrode material diffusion suppression layer 6, from that in the above-described sixth embodiment (see FIG. 11).

Figure 17:
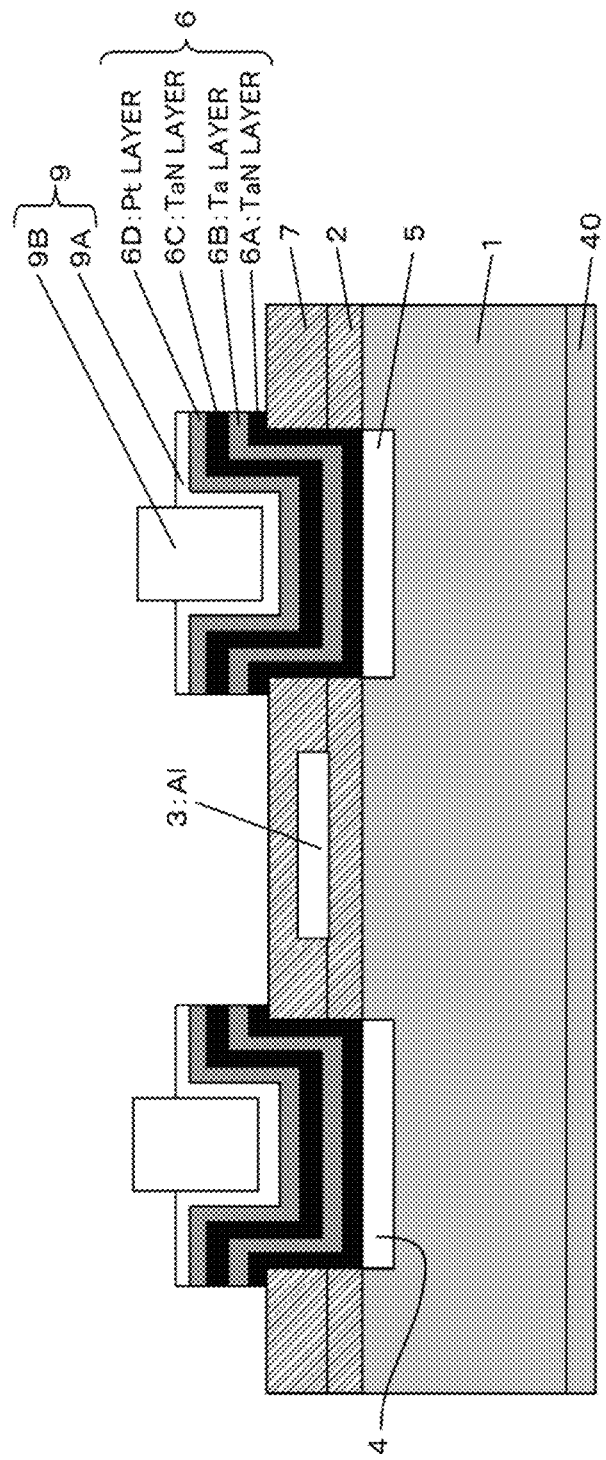
FIG. 17 is a schematic cross-sectional view illustrating the structure of a semiconductor device according to a seventh embodiment.

As depicted in FIG. 17, in this semiconductor device (MIS-type GaN-HEMT), the electrode material diffusion suppression layer 6 provided between the Al layer included in the ohmic electrodes 4 and 5 and the Au interconnection 9 further includes a Pt layer 6D stacked on the TaN layer 6C (second TaN layer). In FIG. 17, the same elements as those in the above-described sixth embodiment (see FIG. 11, for example) are referenced by the like reference symbols.

More specifically, this semiconductor device includes, between the Al layer included in the ohmic electrodes 4 and 5 and the Au interconnection 9, an electrode material diffusion suppression layer 6 structured by stacking a TaN layer 6A, a Ta layer 6B, and a TaN layer 6C, and a Pt layer 6D, in sequence, from the side of the ohmic electrodes 4 and 5.

In this case, since the Au interconnection 9 is formed on the top Pt layer 6D in the electrode material diffusion suppression layer 6, the adhesion between the electrode material diffusion suppression layer 6 and the Au interconnection 9 can be improved, as compared to the electrode material diffusion suppression layer 6 in the above-described sixth embodiment, thereby further improving the reliability. In addition, diffusion of the materials of the Al layer included in the ohmic electrodes 4 and 5 and the Au interconnection 9 can be suppressed more effectively, as compared to the electrode material diffusion suppression layer 6 in the above-described sixth embodiment.

The semiconductor device (MIS-type GaN-HEMT) having the above structure can be manufactured as follows.

More specifically, during the step of forming an electrode material diffusion suppression layer 6 in the method of manufacturing a semiconductor device of the above-described sixth embodiment, a TaN layer 6A, a Ta layer 6B, a TaN layer 6C, and a Pt layer 6D may be stacked in sequence, over the Al layer included in the ohmic electrodes 4 and 5, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Pt layer 6D is referred to as a fourth metal layer.

In this example, sputtering parameters for forming the Ta layer 6B and the TaN layers 6A and 6C are similar to those in the above-described sixth embodiment. In addition, sputtering parameters for forming the Pt layer 6D are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described sixth embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the sixth embodiment as described above.

Eighth Embodiment

A semiconductor device and a method of manufacturing the same according to an eighth embodiment will be described with reference to FIG. 18.

This embodiment has a different structure of the electrode material diffusion suppression layer 6, from that in the above-described sixth embodiment (see FIG. 11).

Figure 18:
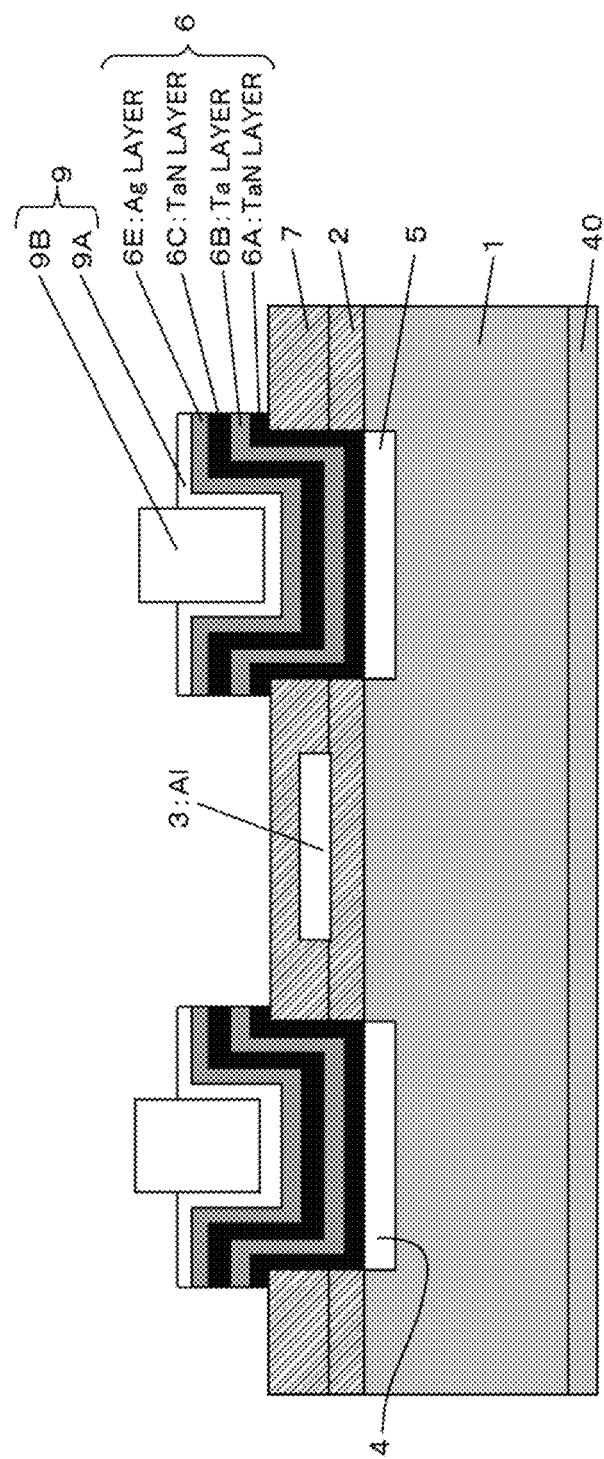
FIG. 18 is a schematic cross-sectional view illustrating the structure of a semiconductor device according to an eighth embodiment.

As depicted in FIG. 18, in this semiconductor device (MIS-type GaN-HEMT), the electrode material diffusion suppression layer 6 provided between the Al layer included in the ohmic electrodes 4 and 5 and the Au interconnection 9 further includes an Ag layer 6E stacked on the TaN layer 6C (second TaN layer). In FIG. 18, the same elements as those in the above-described sixth embodiment (see FIG. 11, for example) are referenced by the like reference symbols.

More specifically, this semiconductor device includes, between the Al layer included in the ohmic electrodes 4 and 5 and the Au interconnection 9, an electrode material diffusion suppression layer 6 structured by stacking a TaN layer 6A, a Ta layer 6B, and a TaN layer 6C, and an Ag layer 6E, in sequence, from the side of ohmic electrodes 4 and 5.

In this case, since the Au interconnection 9 is formed on the top Ag layer 6E in the electrode material diffusion suppression layer 6, the adhesion between the electrode material diffusion suppression layer 6 and the Au interconnection 9 can be improved, as compared to the electrode material diffusion suppression layer 6 in the above-described sixth embodiment, thereby further improving the reliability. In addition, diffusion of the materials of the Al layer included in the ohmic electrodes 4 and 5 and the Au interconnection 9 can be suppressed more effectively, as compared to the electrode material diffusion suppression layer 6 in the above-described sixth embodiment. Furthermore, the manufacturing cost can be reduced, as compared to the electrode material diffusion suppression layer 6 in the above-described seventh embodiment, without reducing the level of the diffusion suppression against the materials of the Al layer included in the ohmic electrodes 4 and 5 and the Au interconnection 9.

The semiconductor device (MIS-type GaN-HEMT) having the above structure can be manufactured as follows.

More specifically, during the step of forming an electrode material diffusion suppression layer 6 in the method of manufacturing a semiconductor device of the above-described sixth embodiment, a TaN layer 6A, a Ta layer 6B, a TaN layer 6C, and a Ag layer 6E may be stacked in sequence, over the Al layer included in the ohmic electrodes 4 and 5, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Ag layer 6E is referred to as a fourth metal layer.

In this example, sputtering parameters for forming the Ta layer 6B and the TaN layers 6A and 6C are similar to those in the above-described sixth embodiment. In addition, sputtering parameters for forming the Ag layer 6E are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described sixth embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the sixth embodiment as described above.

Ninth Embodiment

A semiconductor device and a method of manufacturing the same according to a ninth embodiment will be described with reference to FIG. 19.

This embodiment has a different structure of the electrode material diffusion suppression layer 6, from that in the above-described sixth embodiment (see FIG. 11).

Figure 19:
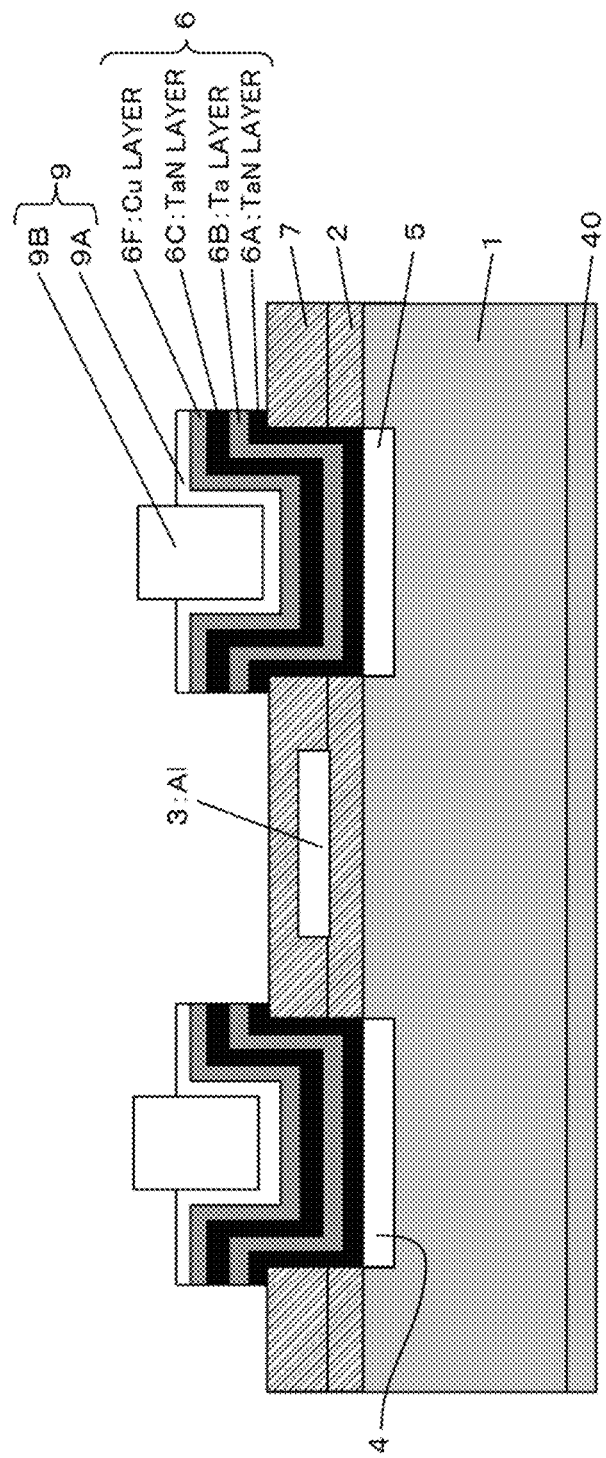
FIG. 19 is a schematic cross-sectional view illustrating the structure of a semiconductor device according to a ninth embodiment.

As depicted in FIG. 19, in this semiconductor device (MIS-type GaN-HEMT), the electrode material diffusion suppression layer 6 provided between the Al layer included in the ohmic electrodes 4 and 5 and the Au interconnection 9 further includes a Cu layer 6F stacked on the TaN layer 6C (second TaN layer). In FIG. 19, the same elements as those in the above-described sixth embodiment (see FIG. 11, for example) are referenced by the like reference symbols.

More specifically, this semiconductor device includes, between the Al layer included in the ohmic electrodes 4 and 5 and the Au interconnection 9, an electrode material diffusion suppression layer 6 structured by stacking a TaN layer 6A, a Ta layer 6B, and a TaN layer 6C, and a Cu layer 6F, in sequence, from the side of the ohmic electrodes 4 and 5.

In this case, since the Au interconnection 9 is formed on the top Cu layer 6F in the electrode material diffusion suppression layer 6, the adhesion between the electrode material diffusion suppression layer 6 and the Au interconnection 9 can be improved, as compared to the electrode material diffusion suppression layer 6 in the above-described sixth embodiment, thereby further improving the reliability. In addition, diffusion of the materials of the Al layer included in the ohmic electrodes 4 and 5 and the Au interconnection 9 can be suppressed more effectively, as compared to the electrode material diffusion suppression layer 6 in the above-described sixth embodiment. Furthermore, the manufacturing cost can be reduced, as compared to the electrode material diffusion suppression layer 6 in the above-described seventh and eighth embodiments, without reducing the adhesion. Furthermore, the manufacturing cost can be reduced, as compared to the electrode material diffusion suppression layer 6 in the above-described eighth embodiment, without reducing the level of the diffusion suppression against the materials of the Al layer included in the ohmic electrodes 4 and 5 and the Au interconnection 9.

The semiconductor device (MIS-type GaN-HEMT) having the above structure can be manufactured as follows.

More specifically, during the step of forming an electrode material diffusion suppression layer 6 in the method of manufacturing a semiconductor device of the above-described sixth embodiment, a TaN layer 6A, a Ta layer 6B, a TaN layer 6C, and a Cu layer 6F may be stacked in sequence, over the Al layer included in the ohmic electrodes 4 and 5, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Cu layer 6F is referred to as a fourth metal layer.

In this example, sputtering parameters for forming the Ta layer 6B and the TaN layers 6A and 6C are similar to those in the above-described sixth embodiment. In addition, sputtering parameters for forming the Cu layer 6F are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described sixth embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the sixth embodiment as described above.

Tenth Embodiment

A semiconductor device and a method of manufacturing the same according to a tenth embodiment will be described with reference to FIG. 20.

This embodiment has a different structure of the electrode material diffusion suppression layer 6, from that in the above-described sixth embodiment (see FIG. 11).

Figure 20:
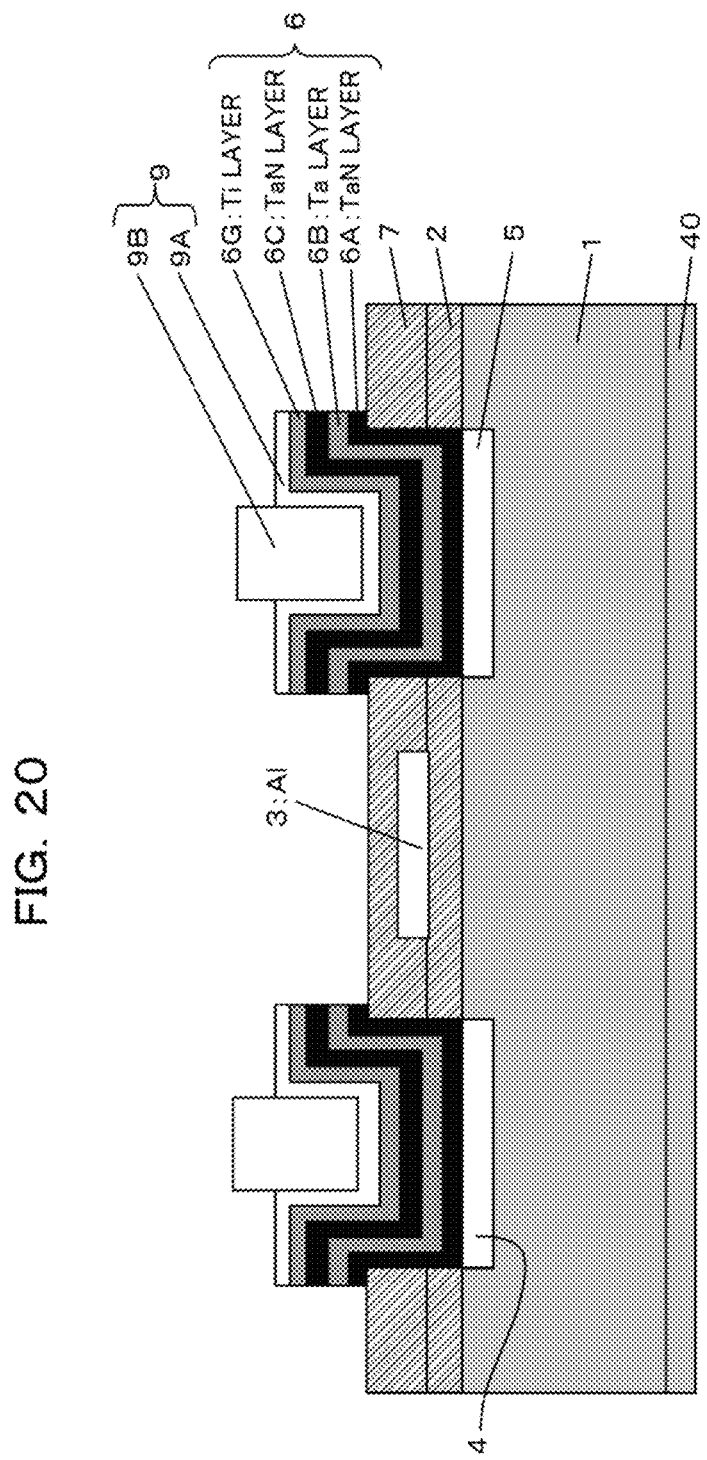
FIG. 20 is a schematic cross-sectional view illustrating the structure of a semiconductor device according to a tenth embodiment.

As depicted in FIG. 20, in this semiconductor device (MIS-type GaN-HEMT), the electrode material diffusion suppression layer 6 provided between the Al layer included in the ohmic electrodes 4 and 5 and the Au interconnection 9 further includes a Ti layer 6G stacked on the TaN layer 6C (second TaN layer). In FIG. 20, the same elements as those in the above-described sixth embodiment (see FIG. 11, for example) are referenced by the like reference symbols.

More specifically, this semiconductor device includes, between the Al layer included in the ohmic electrodes 4 and 5 and the Au interconnection 9, an electrode material diffusion suppression layer 6 structured by stacking a TaN layer 6A, a Ta layer 6B, and a TaN layer 6C, and a Ti layer 6G, in sequence, from the side of the ohmic electrodes 4 and 5.

In this case, since the Au interconnection 9 is formed on the top Ti layer 6G in the electrode material diffusion suppression layer 6, the adhesion between the electrode material diffusion suppression layer 6 and the Au interconnection 9 can be improved, as compared to the electrode material diffusion suppression layer 6 in the above-described sixth embodiment, thereby further improving the reliability. In addition, diffusion of the materials of the Al layer included in the ohmic electrodes 4 and 5 and the Au interconnection 9 can be suppressed more effectively, as compared to the electrode material diffusion suppression layer 6 in the above-described sixth embodiment. Furthermore, the manufacturing cost can be reduced, as compared to the electrode material diffusion suppression layer 6 in the above-described seventh, eighth, and ninth embodiments, without reducing the adhesion. Furthermore, the manufacturing cost can be reduced, as compared to the electrode material diffusion suppression layer 6 in the above-described seventh embodiment, without reducing the level of the diffusion suppression against the materials of the Al layer included in the ohmic electrodes 4 and 5 and the Au interconnection 9.

The semiconductor device (MIS-type GaN-HEMT) having the above structure can be manufactured as follows.

More specifically, during the step of forming an electrode material diffusion suppression layer 6 in the method of manufacturing a semiconductor device of the above-described sixth embodiment, a TaN layer 6A, a Ta layer 6B, a TaN layer 6C, and a Ti layer 6G may be stacked in sequence, over the Al layer included in the ohmic electrodes 4 and 5, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Ti layer 6G is referred to as a fourth metal layer.

In this example, sputtering parameters for forming the Ta layer 6B and the TaN layers 6A and 6C are similar to those in the above-described sixth embodiment. In addition, sputtering parameters for forming the Ti layer 6G are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described sixth embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the sixth embodiment as described above.

Eleventh Embodiment

A semiconductor device and a method of manufacturing the same according to an eleventh embodiment will be described with reference to FIGS. 21 and 22A to 22G.

Figure 21:
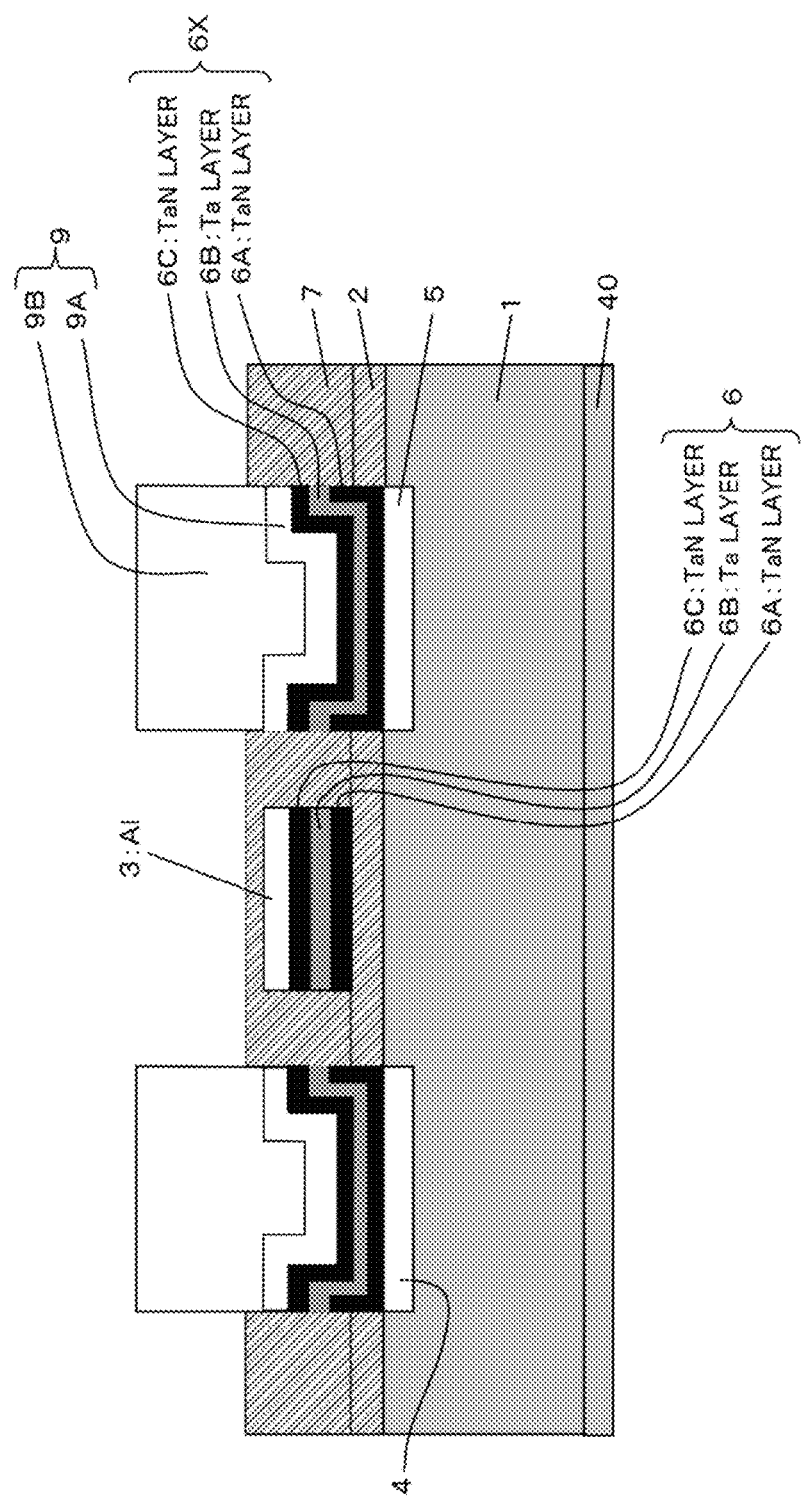
FIG. 21 is a schematic cross-sectional view illustrating the structure of a semiconductor device according to an eleventh embodiment.

More specifically, unlike the above-described first embodiment (see FIG. 1), in this embodiment, in place of the barrier metal layer 8, an electrode material diffusion suppression layer 6X having the same stacked structure as that in the above-described first embodiment is provided between the Al layer included in the ohmic electrodes 4 and 5 and the Au interconnection 9, as depicted in FIG. 21. In FIG. 21, the same elements as those in the above-described first embodiment (see FIG. 1, for example) are referenced by the like reference symbols.

More specifically, this embodiment, by combining the above-described first embodiment (see FIG. 1) and the above-described sixth embodiment (see FIG. 11), provides an electrode material diffusion suppression layer 6 (first electrode material diffusion suppression layer) under the gate electrode 3, while providing an electrode material diffusion suppression layer 6X (second electrode material diffusion suppression layer) over the ohmic electrodes 4 and 5.

In this semiconductor device (MIS-type GaN-HEMT), as depicted in FIG. 21, the first electrode material diffusion suppression layer 6 is provided between the gate electrode 3 and the gate insulation layer 2, wherein the first electrode material diffusion suppression layer 6 has a structure wherein a TaN layer 6A (first TaN layer), a Ta layer 6B, and a TaN layer 6C (second TaN layer) are stacked in sequence.

In addition, the second electrode material diffusion suppression layer 6X is provided between the Al layer included in the ohmic electrodes 4 and 5 and the Au interconnection 9, wherein the second electrode material diffusion suppression layer 6X has a structure wherein a TaN layer 6A (first TaN layer), a Ta layer 6B, and a TaN layer 6C (second TaN layer) are stacked in sequence.

Particularly, the TaN layers 6A and 6C included in the first and second electrode material diffusion suppression layers 6 and 6X preferably have a nitrogen content of greater than about 48% but no more than 52%. More preferably, the nitrogen content may be about 49% or greater but no more than 51%. This range of nitrogen content can suppress diffusion of the electrode material in a reliable manner.

Next, a method of manufacturing a semiconductor according (MIS-type GaN-HEMT) to this embodiment will be described with reference to FIGS. 22A to 22G.

Figure 22:
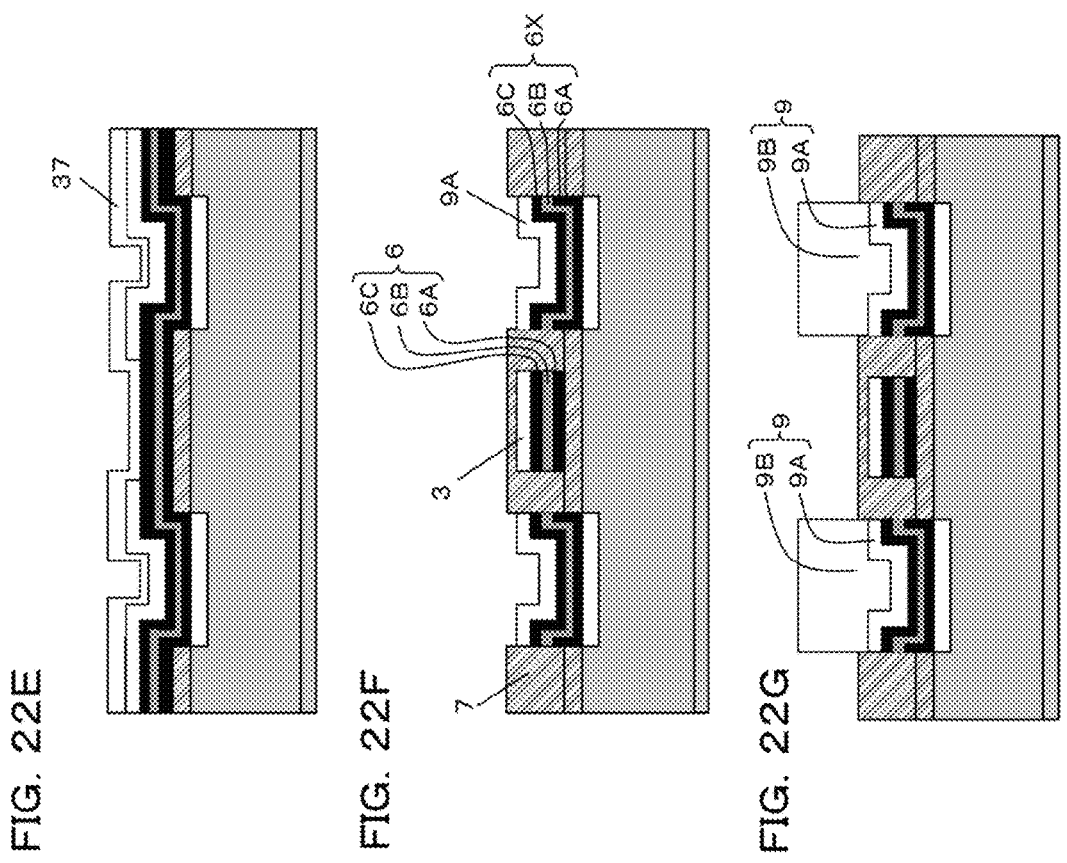
FIGS. 22A to 22G are schematic cross-sectional views illustrating a method of manufacturing a semiconductor device according to the eleventh embodiment.

Firstly, like the above-described first embodiment, as depicted in FIG. 22A, a GaN-based semiconductor stacked structure 1 is formed on a semiconductor substrate 40.

Next, like the above-described first embodiment, as depicted in FIG. 22B, a resist having openings at the ohmic electrode formation regions is provided with photolithography, for example, and the GaN-based semiconductor stacked structure 1, namely, the n-GaN layer 43, in this example, at the ohmic electrode formation regions is removed with a dry etching using a chorine-based gas, for example.

Subsequently, like the above-described first embodiment, as depicted in FIGS. 22B and 22C, Al-containing ohmic electrodes (source electrode and drain electrodes, in this embodiment) 4 and 5, made of Ti/Al, for example, are formed on the GaN-based semiconductor stacked structure 1, namely, the n-AlGaN electron supply layer 42, in this embodiment, with photolithography, and evaporation and lift-off techniques, for example. More specifically, a first resist film 30 and a second resist film 31 having openings at the ohmic electrode formation regions are formed over the n-AlGaN electron supply layer 42 with photolithography, for example. Next, a Ti layer and an Al layer are formed, in sequence, over the entire surface, i.e., on the surface of the second resist film 31 and in the openings with evaporation, for example. Note that the Ti layer and the Al layer are correctively denoted by the reference numeral 32 in FIG. 22B. The Ti layer and the Al layer formed in the openings are remained after removing the first resist film 30 and the second resist film 31, and the Al-containing ohmic electrodes 4 and 5 made of Ti/Al, for example, are formed. Thereafter, the ohmic characteristic is established by an annealing process between about 400° C. to about 1000° C., such as at 550° C., for example, in nitrogen atmosphere, for example.

As in the above-described first embodiment, when a gate recess is provided, a resist having an opening at a region wherein a gate electrode is to be formed (hereinafter, gate electrode formation region) may be provided with photolithography, for example. Thereafter, the n-GaN layer 43 and the n-AlGaN electron supply layer 42 at the gate electrode formation region may be removed, with a dry etching using a fluorine-based gas, for example.

Next, like the above-described first embodiment, as depicted in FIG. 22D, an AlO film (e.g., Al$_2$O$_3$ film), as a gate insulation film, is formed on the GaN-based semiconductor stacked structure 1 with an ALD technique, for example. Next, a resist having openings above the ohmic electrodes 4 and 5 is provided with photolithography, for example, and the AlO film 2 as a gate insulation film above the ohmic electrodes 4 and 5 is removed with an ion milling technique using Ar gas, for example.

Next, a TaN layer 33, a Ta layer 34, and a TaN layer 35 are stacked in sequence over the ohmic electrodes 4 and 5

(Al layer included in the Al-containing ohmic electrodes in this example) and the AlO film 2, as a gate insulation film, with sputtering, for example.

Next, gold (Au), which is an interconnection material, is deposited with sputtering, for example, to form an Au layer 36.

Next, a resist having an opening at the gate electrode formation region is provided with photolithography, for example, and the Au layer 36 being formed at the gate electrode formation region is removed with an ion milling technique using Ar gas, for example, as depicted in FIG. 22E.

Next, aluminum (Al), which is a gate electrode material, is deposited with sputtering, for example, to form an Al layer 37.

Next, a resist is provided above the gate electrode formation region and the ohmic electrodes 4 and 5 with photolithography, for example, and the TaN layer 6A, the Ta layer 6B, the TaN layer 6C, the Au layer 36, and the Al layer 37, being formed at a region other than regions above the gate electrode formation region and the ohmic electrodes 4 and 5, are removed with an ion milling technique using Ar gas, for example, as depicted in FIG. 22F.

In the above processes, the first electrode material diffusion suppression layer 6 structured by stacking the TaN layer 6A, the Ta layer 6B, and the TaN layer 6C, in sequence, is formed over the gate insulation film 2. In addition, the second electrode material diffusion suppression layer 6X structured by stacking the TaN layer 6A, the Ta layer 6B, and the TaN layer 6C, in sequence, is formed over the ohmic electrodes 4 and 5. In the above processes, the first and second electrode material diffusion suppression layers 6 and 6X are formed simultaneously. Note that the TaN layer 6A is referred to as a first TaN layer or a first metal layer, the Ta layer 6B is referred to as a second metal layer, and the TaN layer 6C is referred to as a second TaN layer or a third metal layer. Although the first and second electrode material diffusion suppression layers 6 and 6X are formed simultaneously, they may be formed in separate steps.

Furthermore, a gate electrode 3 made of an Al layer is formed on the first electrode material diffusion suppression layer 6, namely, on the TaN layer 6C included in the first electrode material diffusion suppression layer 6, in this example. In other words, the gate electrode 3 made of an Al layer is formed over the GaN-based semiconductor stacked structure 1, having the AlO film 2 as a gate insulation film and the first electrode material diffusion suppression layer 6 interposed therebetween. In this manner, an MIS structure is formed.

Furthermore, a first Au layer 9A to constitute an Au interconnection 9 is formed on the second electrode material diffusion suppression layer 6X, namely, on the TaN layer 6C included in the electrode material diffusion suppression layer 6X, in this example.

Next, like the above-described first embodiment, again, an AlO film 7 (e.g., $Al_2O_3$ film), as an insulation film, is formed on the Al layer 3 as a gate electrode and the first Au layer 9A, with an ALD technique, for example. Next, a resist having openings at regions above the ohmic electrodes 4 and 5 is provided with photolithography, for example, and the insulating film 7 above the ohmic electrodes 4 and 5 is removed with an ion milling technique using Ar gas, for example.

Next, like the above-described first embodiment, a resist having openings at regions above the ohmic electrodes 4 and 5 is formed with photolithography, for example, and a second Au layer 9B is formed on the first Au layer 9A with a plating technique, for example, as depicted in FIG. 22G. Thereby, the Au interconnection 9 made of the first Au layer 9A and the second Au layer 9B is formed on the second electrode material diffusion suppression layer 6X. More specifically, the second electrode material diffusion suppression layer 6X is formed on the Al-containing ohmic electrodes 4 and 5, and the Au interconnection 9 is formed on the second electrode material diffusion suppression layer 6X.

Subsequently, like the above-described first embodiment, a SiN film (insulation film), which is not illustrated, is formed over the entire surface with a CVD technique, for example.

In the above processes, a semiconductor device (MIS-type GaN-HEMT) is manufactured.

The other details are similar to those in the above-described first embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the first and sixth embodiments described above.

Twelfth Embodiment

A semiconductor device and a method of manufacturing the same according to a twelfth embodiment will be described with reference to FIG. 23.

This embodiment has different structures of the first and second electrode material diffusion suppression layers 6 and 6X, from those in the above-described eleventh embodiment (see FIG. 21).

Figure 23:
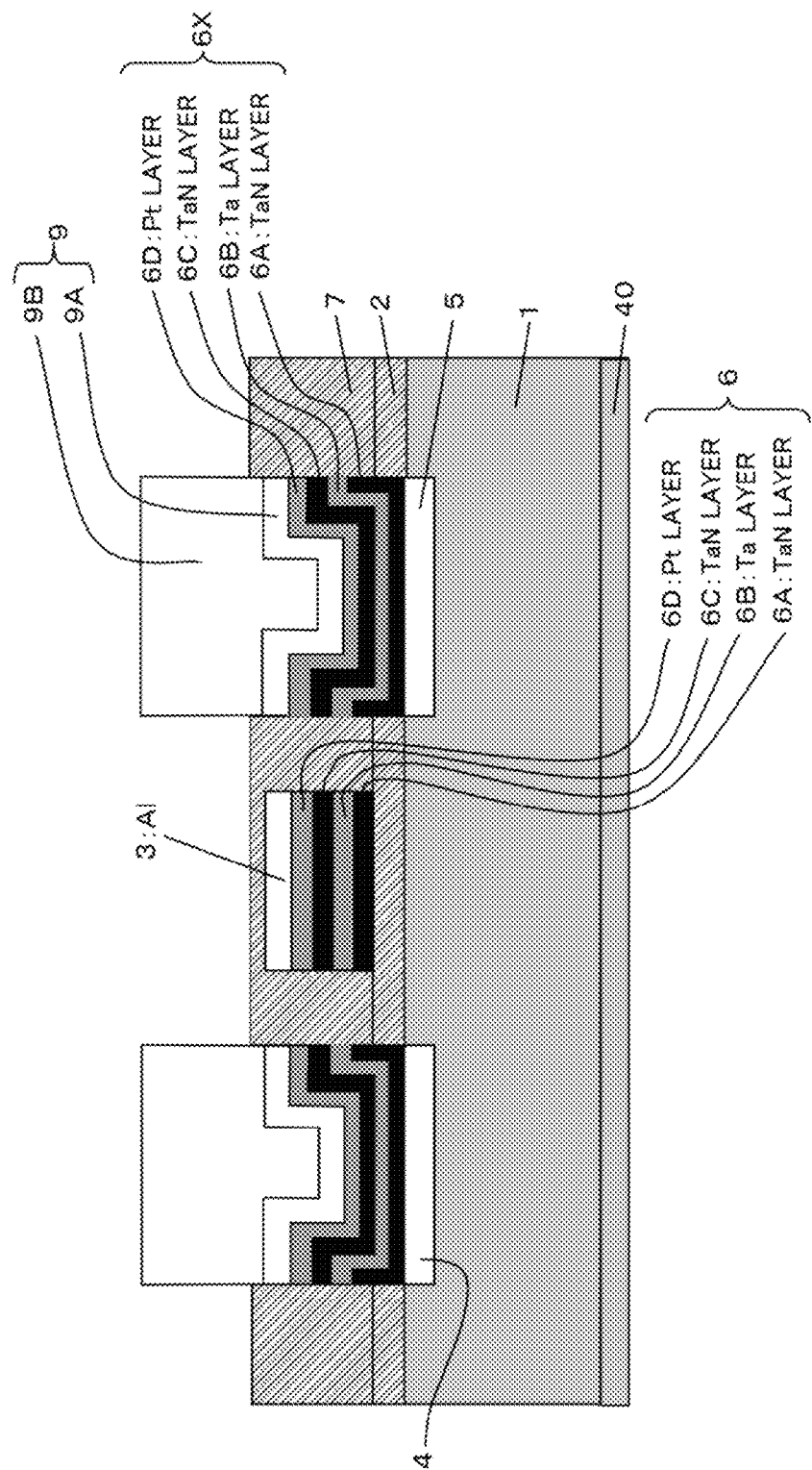
FIG. 23 is a schematic cross-sectional view illustrating the structure of a semiconductor device according to a twelfth embodiment.

As depicted in FIG. 23, in this semiconductor device (MIS-type GaN-HEMT), the first and second electrode material diffusion suppression layers 6 and 6X further include a Pt layer 6D stacked on the TaN layer (second TaN layer) 6C. In FIG. 23, the same elements as those in the above-described eleventh embodiment (see FIG. 21, for example) are referenced by the like reference symbols.

More specifically, this semiconductor device includes a first electrode material diffusion suppression layer 6 structured by stacking a TaN layer 6A, a Ta layer 6B, a TaN layer 6C, and a Pt layer 6D in sequence, and a second electrode material diffusion suppression layer 6X structured by stacking a TaN layer 6A, a Ta layer 6B, a TaN layer 6C, and a Pt layer 6D in sequence.

In this case, since the gate electrode 3 made of an Al layer is formed on the top Pt layer 6D in the first electrode material diffusion suppression layer 6, the adhesion between the electrode material diffusion suppression layer 6 and the gate electrode 3 can be improved, as compared to the first electrode material diffusion suppression layer 6 in the above-described eleventh embodiment, thereby further improving the reliability. Furthermore, diffusion of the Al gate electrode material can be suppressed more effectively, as compared to the first electrode material diffusion suppression layer 6 in the above-described eleventh embodiment.

Furthermore, since the Au interconnection 9 is formed on the top Pt layer 6D in the second electrode material diffusion suppression layer 6X, the adhesion between the second electrode material diffusion suppression layer 6X and the Au interconnection 9 can be improved, as compared to the second electrode material diffusion suppression layer 6X in the above-described eleventh embodiment, thereby further improving the reliability. In addition, diffusion of the materials of the Al layer included in the ohmic electrodes 4 and 5 and the Au interconnection 9 can be suppressed more effectively, as compared to the second electrode material diffusion suppression layer 6X in the above-described eleventh embodiment.

The semiconductor device (MIS-type GaN-HEMT) having the above structure can be manufactured as follows.

More specifically, in the step of forming first and second electrode material diffusion suppression layers 6 and 6X in the method of manufacturing a semiconductor device of the above-described eleventh embodiment, a TaN layer 6A, a Ta layer 6B, a TaN layer 6C, and a Pt layer 6D may be stacked in sequence, on the Al layer included in the ohmic electrodes 4 and 5 and the AlO film 2 as a gate insulation film, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, the Pt layer 6D is referred to as a fourth metal layer.

In this example, sputtering parameters for forming the Ta layer 6B and the TaN layers 6A and 6C are similar to those in the above-described eleventh embodiment. In addition, sputtering parameters for forming the Pt layer 6D are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described eleventh embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the eleventh embodiment as described above.

Thirteenth Embodiment

A semiconductor device and a method of manufacturing the same according to a thirteenth embodiment will be described with reference to FIG. 24.

This embodiment has different structures of the first and second electrode material diffusion suppression layers 6 and 6X, from those in the above-described eleventh embodiment (see FIG. 21).

Figure 24:
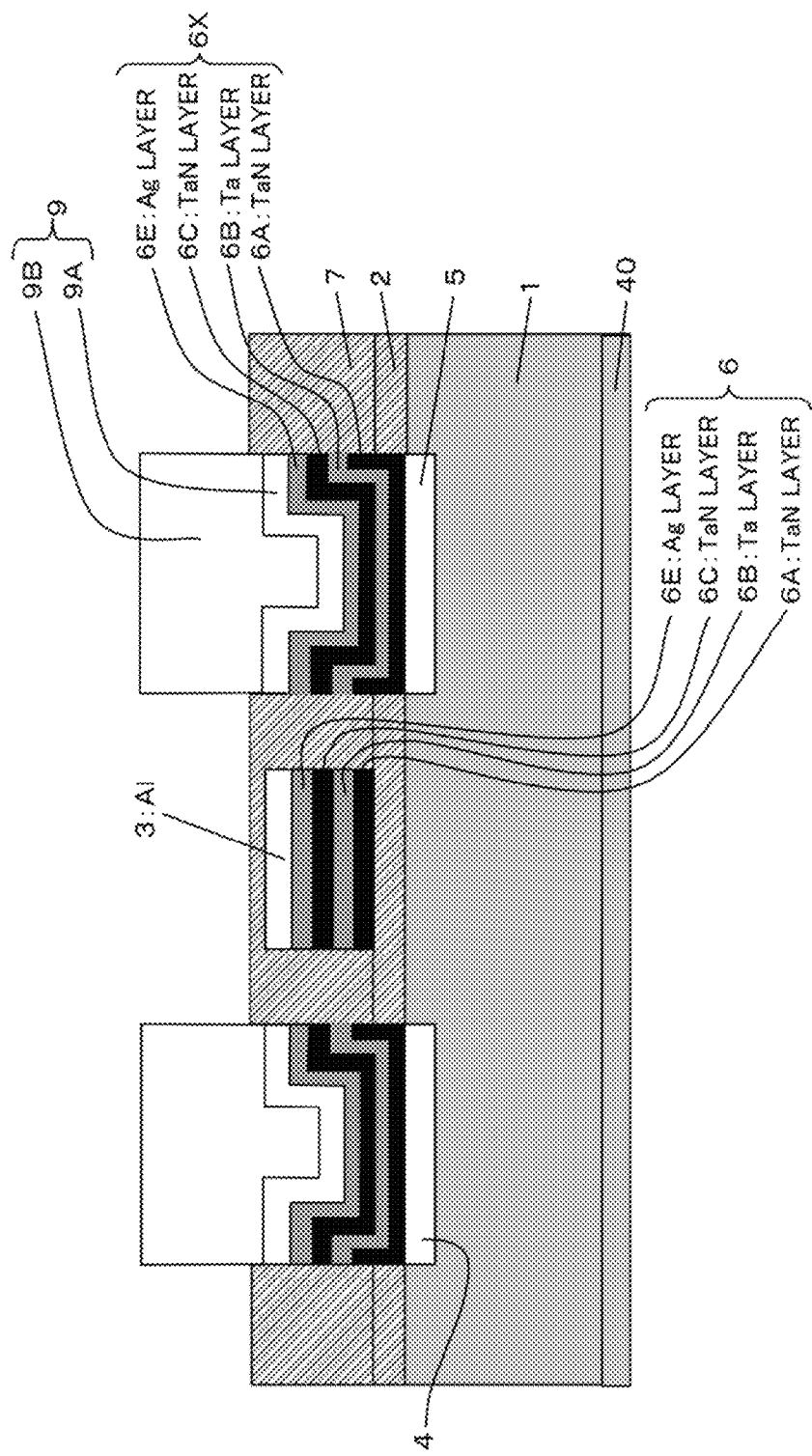
FIG. 24 is a schematic cross-sectional view illustrating the structure of a semiconductor device according to a thirteenth embodiment.

As depicted in FIG. 24, in this semiconductor device (MIS-type GaN-HEMT), the first and second electrode material diffusion suppression layers 6 and 6X further include an Ag layer 6E stacked on the TaN layer (second TaN layer) 6C. In FIG. 24, the same elements as those in the above-described eleventh embodiment (see FIG. 21, for example) are referenced by the like reference symbols.

More specifically, this semiconductor device includes a first electrode material diffusion suppression layer 6 structured by stacking a TaN layer 6A, a Ta layer 6B, a TaN layer 6C, and an Ag layer 6E in sequence, and a second electrode material diffusion suppression layer 6X structured by stacking a TaN layer 6A, a Ta layer 6B, a TaN layer 6C, and an Ag layer 6E in sequence.

In this case, since the gate electrode 3 made of an Al layer is formed on the top Ag layer 6E in the first electrode material diffusion suppression layer 6, the adhesion between the electrode material diffusion suppression layer 6 and the gate electrode 3 can be improved, as compared to the first electrode material diffusion suppression layer 6 in the above-described eleventh embodiment, thereby further improving the reliability. Furthermore, diffusion of the Al gate electrode material can be suppressed more effectively, as compared to the first electrode material diffusion suppression layer 6 in the above-described eleventh embodiment. Furthermore, the manufacturing cost can be reduced, as compared to the first electrode material diffusion suppression layer 6 in the above-described twelfth embodiment, without reducing the level of the diffusion suppression against the Al gate electrode material.

Furthermore, since the Au interconnection 9 is formed on the top Ag layer 6E in the second electrode material diffusion suppression layer 6X, the adhesion between the second electrode material diffusion suppression layer 6X and the Au interconnection 9 can be improved, as compared to the second electrode material diffusion suppression layer 6X in the above-described eleventh embodiment, thereby further improving the reliability. In addition, diffusion of the materials of the Al layer included in the ohmic electrodes 4 and 5 and the Au interconnection 9 can be suppressed more effectively, as compared to the second electrode material diffusion suppression layer 6X in the above-described eleventh embodiment. Furthermore, the manufacturing cost can be reduced, as compared to the second electrode material diffusion suppression layer 6X in the above-described twelfth embodiment, without reducing the level of the diffusion suppression against the materials of the Al layer included in the ohmic electrodes 4 and 5 and the Au interconnection 9.

The semiconductor device (MIS-type GaN-HEMT) having the above structure can be manufactured as follows.

More specifically, in the step of forming first and second electrode material diffusion suppression layers 6 and 6X in the method of manufacturing a semiconductor device of the above-described eleventh embodiment, a TaN layer 6A, a Ta layer 6B, a TaN layer 6C, and an Ag layer 6E may be stacked in sequence, over the Al layer included in the ohmic electrodes 4 and 5 and the AlO film 2 as a gate insulation film, with sputtering, for example. Note that the TaN layer 6A is referred to as a first TaN layer or a first metal layer, the Ta layer 6B is referred to a second metal layer, the TaN layer 6C is referred to as a second TaN layer or a third metal layer, and the Ag layer 6E is referred to as fourth metal layer.

In this example, sputtering parameters for forming the Ta layer 6B and the TaN layers 6A and 6C are similar to those in the above-described eleventh embodiment. In addition, sputtering parameters for forming the Ag layer 6E are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described eleventh embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the eleventh embodiment as described above.

Fourteenth Embodiment

A semiconductor device and a method of manufacturing the same according to a fourteenth embodiment will be described with reference to FIG. 25.

This embodiment has different structures of the first and second electrode material diffusion suppression layers 6 and 6X, from those in the above-described eleventh embodiment (see FIG. 21).

Figure 25:
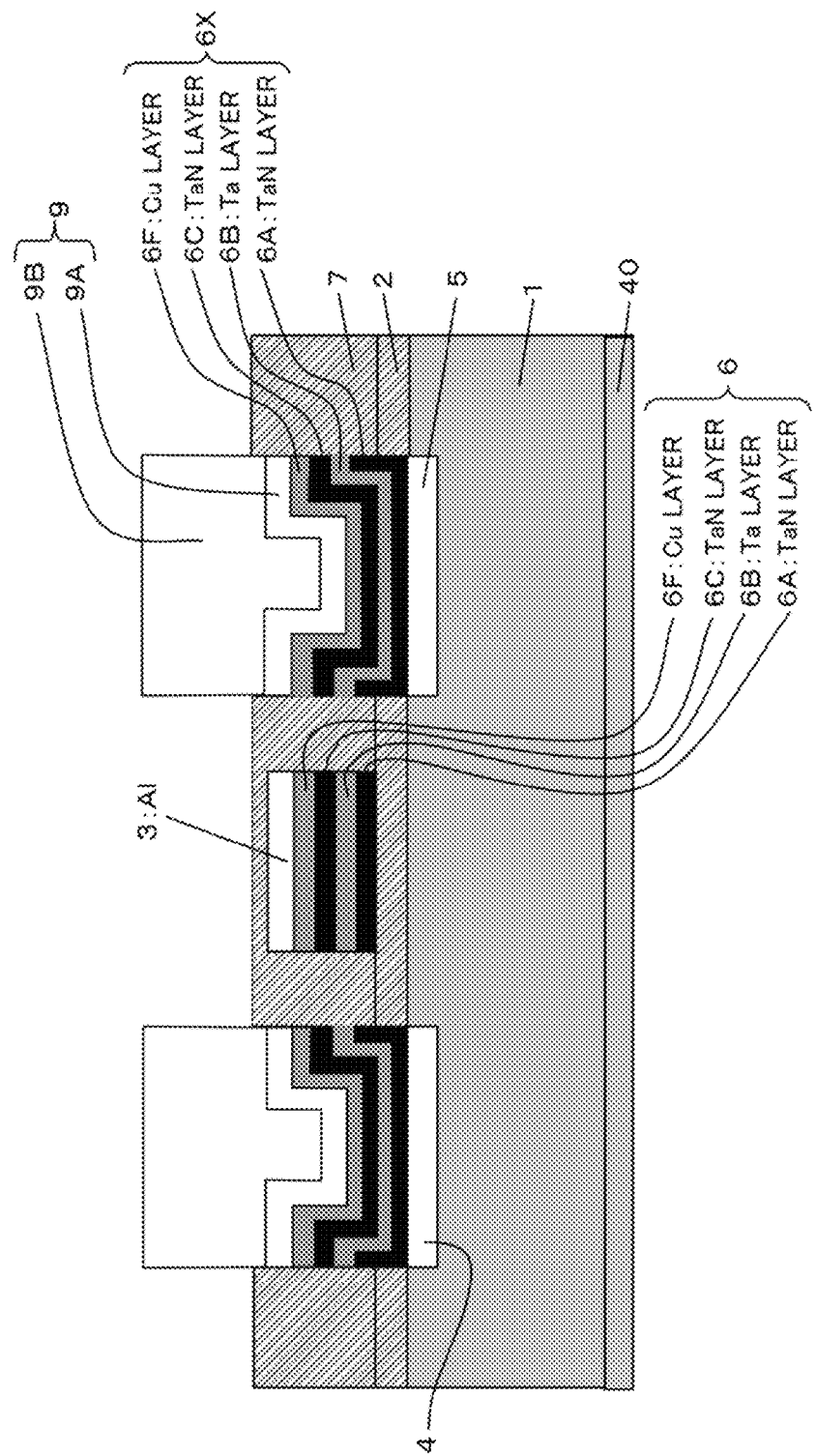
FIG. 25 is a schematic cross-sectional view illustrating the structure of a semiconductor device according to a fourteenth embodiment.

As depicted in FIG. 25, in this semiconductor device (MIS-type GaN-HEMT), the first and second electrode material diffusion suppression layers 6 and 6X further include a Cu layer 6F stacked on the TaN layer (second TaN layer) 6C. In FIG. 25, the same elements as those in the above-described eleventh embodiment (see FIG. 21, for example) are referenced by the like reference symbols.

More specifically, this semiconductor device includes a first electrode material diffusion suppression layer 6 structured by stacking a TaN layer 6A, a Ta layer 6B, a TaN layer 6C, and a Cu layer 6F in sequence, and a second electrode material diffusion suppression layer 6X structured by stacking a TaN layer 6A, a Ta layer 6B, a TaN layer 6C, and a Cu layer 6F in sequence.

In this case, since the gate electrode 3 made of an Al layer is formed on the top Cu layer 6F in the first electrode material diffusion suppression layer 6, the adhesion between the electrode material diffusion suppression layer 6 and the gate electrode 3 can be improved, as compared to the first electrode material diffusion suppression layer 6 in the above-described eleventh embodiment, thereby further improving the reliability. Furthermore, diffusion of the Al gate electrode material can be suppressed more effectively, as compared to the first electrode material diffusion suppression layer 6 in the above-described eleventh embodiment. Furthermore, the manufacturing cost can be reduced, as compared to the first electrode material diffusion suppression layer 6 in the above-described twelfth and thirteenth embodiments, without reducing the adhesion. Furthermore, the manufacturing cost can be reduced, as compared to the first electrode material diffusion suppression layer 6 in the above-described thirteenth embodiment, without reducing the level of the diffusion suppression against the Al gate electrode material.

Furthermore, since the Au interconnection 9 is formed on the top Cu layer 6F in the second electrode material diffusion suppression layer 6X, the adhesion between the second electrode material diffusion suppression layer 6X and the Au interconnection 9 can be improved, as compared to the second electrode material diffusion suppression layer 6X in the above-described eleventh embodiment, thereby further improving the reliability. In addition, diffusion of the materials of the Al layer included in the ohmic electrodes 4 and 5 and the Au interconnection 9 can be suppressed more effectively, as compared to the second electrode material diffusion suppression layer 6X in the above-described eleventh embodiment. Furthermore, the manufacturing cost can be reduced, as compared to the second electrode material diffusion suppression layer 6X in the above-described twelfth and thirteenth embodiments, without reducing the adhesion. Furthermore, the manufacturing cost can be reduced, as compared to the second electrode material diffusion suppression layer 6X in the above-described thirteenth embodiment, without reducing the level of the diffusion suppression against the materials of the Al layer included in the ohmic electrodes 4 and 5 and the Au interconnection 9.

The semiconductor device (MIS-type GaN-HEMT) having the above structure can be manufactured as follows.

More specifically, in the step of forming first and second electrode material diffusion suppression layers 6 and 6X in the method of manufacturing a semiconductor device of the above-described eleventh embodiment, a TaN layer 6A, a Ta layer 6B, a TaN layer 6C, and a Cu layer 6F may be stacked in sequence, over the Al layer included in the ohmic electrodes 4 and 5 and the AlO film 2 as a gate insulation film, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and a the Cu layer 6F is referred to as fourth metal layer.

In this example, sputtering parameters for forming the Ta layer 6B and the TaN layers 6A and 6C are similar to those in the above-described eleventh embodiment. In addition, sputtering parameters for forming the Cu layer 6F are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described eleventh embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the eleventh embodiment as described above.

Fifteenth Embodiment

A semiconductor device and a method of manufacturing the same according to a fifteenth embodiment will be described with reference to FIG. 26.

This embodiment has different structures of the first and second electrode material diffusion suppression layers 6 and 6X, from those in the above-described eleventh embodiment (see FIG. 21).

Figure 26:
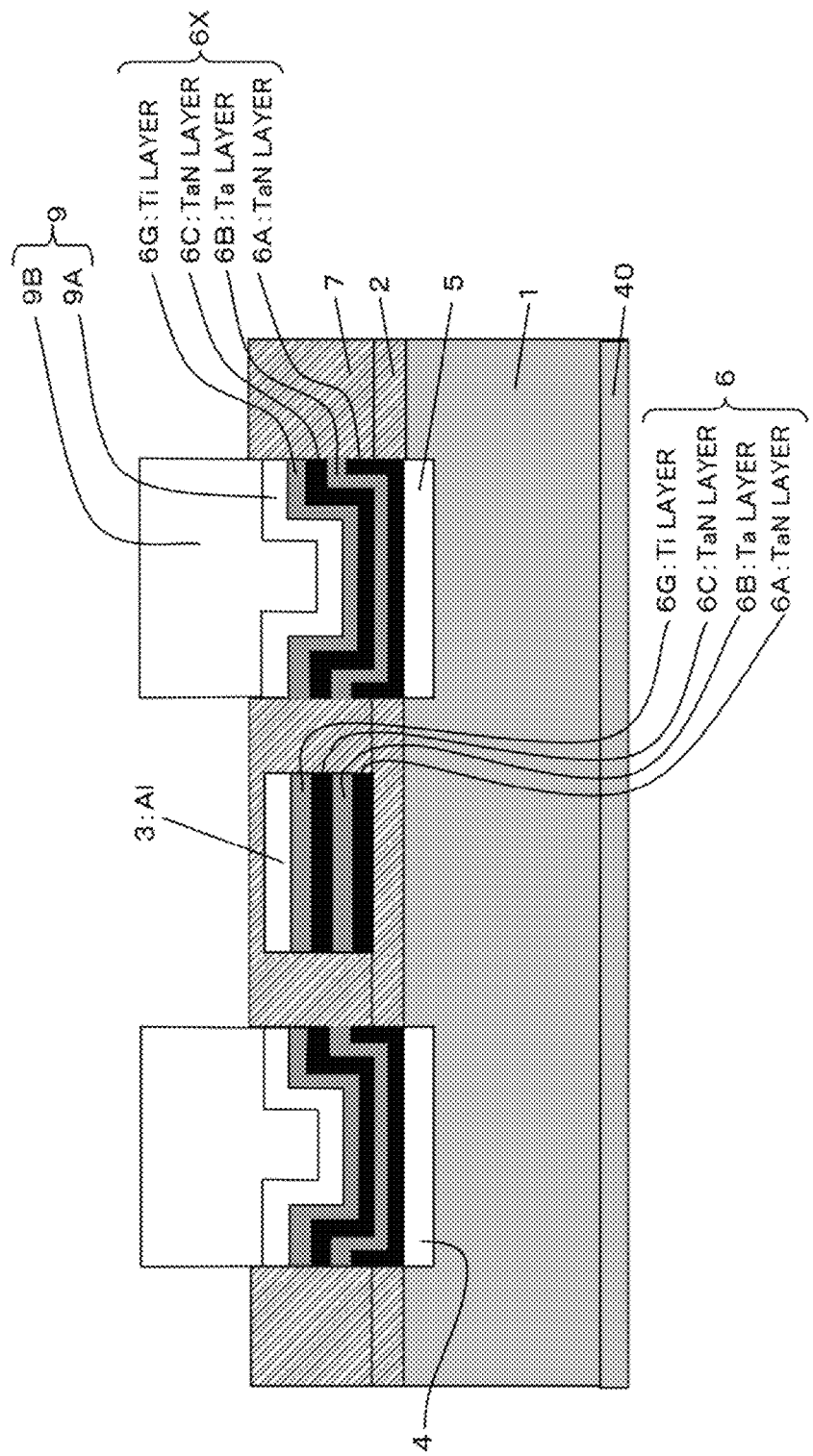
FIG. 26 is a schematic cross-sectional view illustrating the structure of a semiconductor device according to a fifteenth embodiment.

As depicted in FIG. 26, in this semiconductor device (MIS-type GaN-HEMT), the first and second electrode material diffusion suppression layers 6 and 6X further include a Ti layer 6G stacked on the TaN layer (second TaN layer) 6C. In FIG. 26, the same elements as those in the above-described eleventh embodiment (see FIG. 21, for example) are referenced by the like reference symbols.

More specifically, this semiconductor device includes a first electrode material diffusion suppression layer 6 structured by stacking a TaN layer 6A, a Ta layer 6B, a TaN layer 6C, and a Ti layer 6G in sequence, and a second electrode material diffusion suppression layer 6X structured by stacking a TaN layer 6A, a Ta layer 6B, a TaN layer 6C, and a Ti layer 6G in sequence.

In this case, since the gate electrode 3 made of an Al layer is formed on the top Ti layer 6G in the first electrode material diffusion suppression layer 6, the adhesion between the electrode material diffusion suppression layer 6 and the gate electrode 3 can be improved, as compared to the first electrode material diffusion suppression layer 6 in the above-described eleventh embodiment, thereby further improving the reliability. Furthermore, diffusion of the Al gate electrode material can be suppressed more effectively, as compared to the first electrode material diffusion suppression layer 6 in the above-described eleventh embodiment. Furthermore, the manufacturing cost can be reduced, as compared to the first electrode material diffusion suppression layer 6 in the above-described twelfth, thirteenth, and fourteenth embodiments, without reducing the adhesion. Furthermore, the manufacturing cost can be reduced, as compared to the first electrode material diffusion suppression layer 6 in the above-described twelfth embodiment, without reducing the level of the diffusion suppression against the Al gate electrode material.

Furthermore, since the Au interconnection 9 is formed on the top Ti layer 6G in the second electrode material diffusion suppression layer 6X, the adhesion between the second electrode material diffusion suppression layer 6X and the Au interconnection 9 can be improved, as compared to the second electrode material diffusion suppression layer 6X in the above-described eleventh embodiment, thereby further improving the reliability. In addition, diffusion of the materials of the Al layer included in the ohmic electrodes 4 and 5 and the Au interconnection 9 can be suppressed more effectively, as compared to the second electrode material diffusion suppression layer 6X in the above-described eleventh embodiment. Furthermore, the manufacturing cost can be reduced, as compared to the second electrode material diffusion suppression layer 6X in the above-described twelfth, thirteenth, and fourteenth embodiments, without reducing the adhesion. Furthermore, the manufacturing cost can be reduced, as compared to the second electrode material diffusion suppression layer 6X in the above-described twelfth embodiment, without reducing the level of the diffusion suppression against the materials of the Al layer included in the ohmic electrodes 4 and 5 and the Au interconnection 9.

The semiconductor device (MIS-type GaN-HEMT) having the above structure can be manufactured as follows.

More specifically, in the step of forming first and second electrode material diffusion suppression layers 6 and 6X in the method of manufacturing a semiconductor device of the above-described eleventh embodiment, a TaN layer 6A, a Ta layer 6B, a TaN layer 6C, and a Ti layer 6G may be stacked in sequence, over the Al layer included in the ohmic electrodes 4 and 5 and the AlO film 2 as a gate insulation film, with sputtering, for example. Note that the TaN layer 6A is referred to as a first TaN layer or a first metal layer, the Ta layer 6B is referred to as a second metal layer, the TaN layer 6C is referred to as a second TaN layer or a third metal layer, and the Ti layer 6G is referred to as a fourth metal layer.

In this example, sputtering parameters for forming the Ta layer 6B and the TaN layers 6A and 6C are similar to those in the above-described eleventh embodiment. In addition, sputtering parameters for forming the Ti layer 6G are as follows: a degree of vacuum (pressure) of about 0.8 Pa and a power of about 0.8 kW, for example. The target-substrate distance (T/S) is about 200 mm, for example.

The details of other structures and the fabrication method are similar to those in the above-described eleventh embodiment, and descriptions thereof will be omitted.

As described above, the semiconductor device and the method of manufacturing the same according to this embodiment is advantageous in that diffusion of an electrode material can be suppressed, thereby achieving further improved characteristics, as in the eleventh embodiment as described above.

Sixteenth Embodiment

Next, a semiconductor device and a method of manufacturing the same, and a power supply apparatus according to a sixteenth embodiment will be described with reference to FIGS. 27 and 28.

The semiconductor device according to the present embodiment is a semiconductor package including a semiconductor chip of a semiconductor device (GaN-HEMT) according to any one of the above-described embodiments and their variants. Note that such a semiconductor chip is also referred to as a HEMT chip.

Hereinafter, the embodiment will be described with reference to a discrete package.

Figure 27:
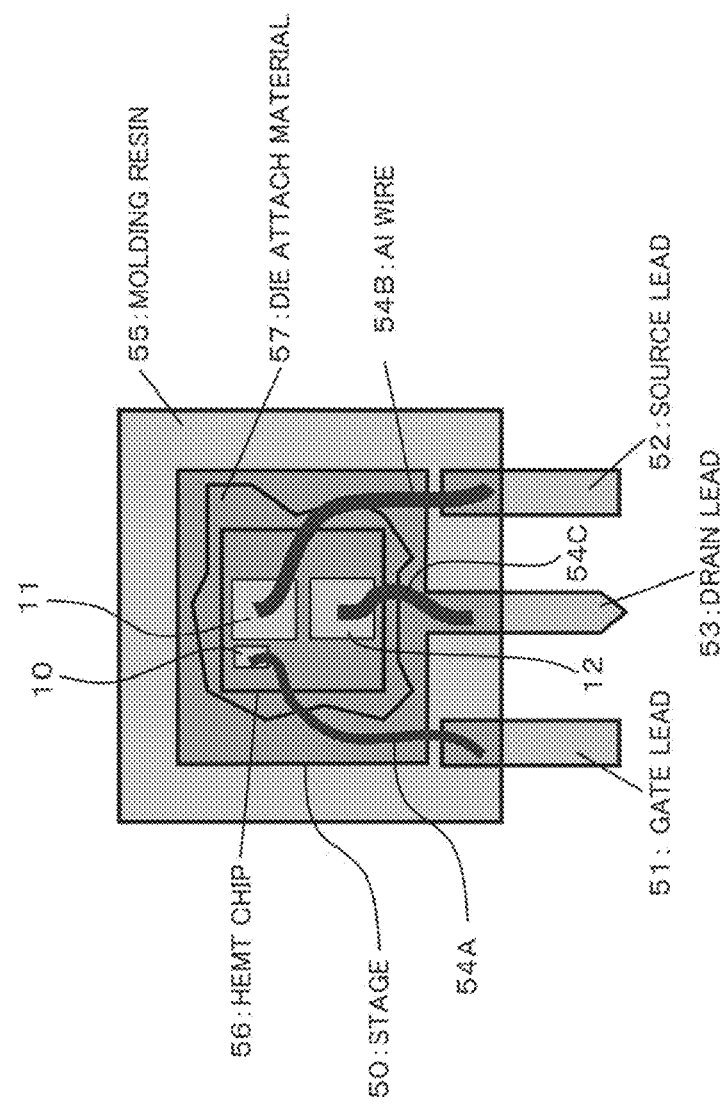
FIG. 27 is a schematic plan view illustrating the structure of a semiconductor device (semiconductor package) according to a sixteenth embodiment.

As depicted in FIG. 27, this semiconductor device includes a stage 50 mounting a semiconductor chip 56 according to any one of the above-described embodiments and their variants, a gate lead 51, a source lead 52, a drain lead 53, bonding wires 54A to 54C (Al wires, in this embodiment), and an encapsulation resin 55. Note that such a semiconductor chip 56 is also referred to as a HEMT chip. Note that the encapsulation resin 55 is also referred to as a molding resin.

The gate pad 10, the source pad 11, and the drain pad 12 in the semiconductor chip 56 mounted on the stage 50 are connected to the gate lead 51, the source lead 52 and the drain lead 53 through the Al wire 54A to 54C, respectively, which then undergoes resin encapsulation.

In this embodiment, the stage 50, to which the back face of the substrate in the semiconductor chip 56 is secured with a die attach material 57 (solder, in this embodiment), is electrically connected to the drain lead 53. Note that the configuration is not limited to the one described above, and the stage 50 may be electrically connected to the source lead 52.

Next, a method of manufacturing a semiconductor device (discrete package) according to the present embodiment will be described.

Initially, a semiconductor chip 56 (GaN-HEMT) according to any one of the above-described embodiments and their variants is secured on the stage 50 of a lead frame, with the die attach material 57 (solder, in this embodiment), for example.

Subsequently, the gate pad 10, the drain pad 12, and the source pad 11 in the semiconductor chip 56 are connected to the gate lead 51, the drain lead 53, and the source lead 52, through bonding with the Al wire 54A to 54C, respectively, for example.

After resin encapsulation using the transfer mold technique, for example, the lead frame is separated.

The semiconductor device according to the present embodiment (discrete package) may be fabricated in the steps set forth above.

While this embodiment has been described with reference to the discrete package wherein the pads 10-12 in the semiconductor chip 56 are used as bonding pads for wire bonding in this embodiment, this is not limiting and other semiconductor packages may also be used. For example, a semiconductor package may be used wherein pads in the semiconductor chip are used as bonding pads for wireless bonding, such as flip chip bonding, for example. A wafer level package may also be used. Alternatively, semiconductor packages other than a discrete package may also be used.

Next, a power supply apparatus including a semiconductor package including the above-described GaN-HEMI will be described with reference to FIG. 28.

Hereinafter, an embodiment will be described with reference to an example wherein a GaN-HEMI included in the above-described semiconductor package is used in a power factor correction (PFC) circuit provided in a power supply apparatus for a server.

Figure 28:
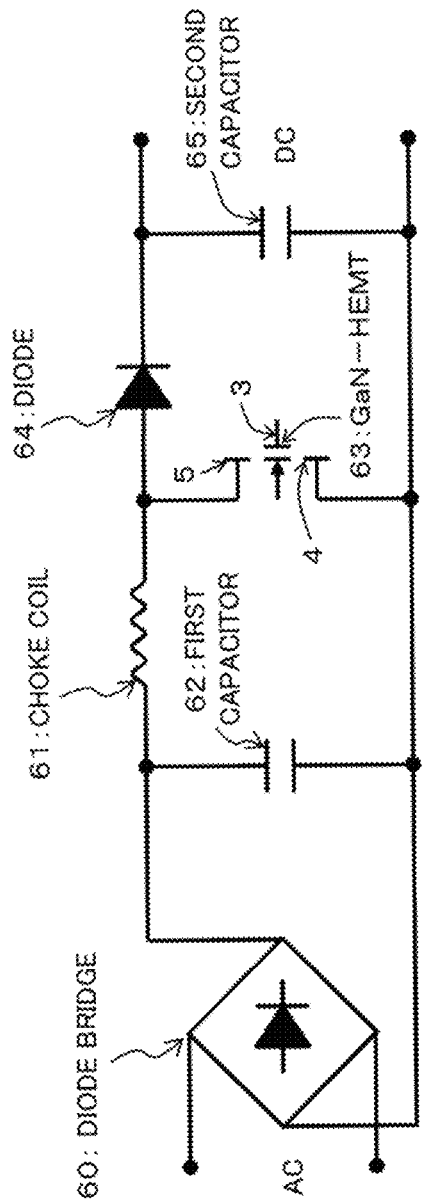
FIG. 28 is a schematic view illustrating the structure of a PFC circuit included in a power supply apparatus according to the sixteenth embodiment.

As depicted in FIG. 28, this PFC circuit includes diode bridge 60, a choke coil 61, a first capacitor 62, a GaN-HEMI 63 included in the above-described semiconductor package, a diode 64, and a second capacitor 65.

In this embodiment, this PFC circuit is configured to include the diode bridge 60, the choke coil 61, the first capacitor 62, GaN-HEMI 63 included in the above-described semiconductor package, the diode 64, and the second capacitor 65, mounted over a circuit substrate.

In the present embodiment, the drain lead 53, the source lead 52, and the gate lead 51 in the above-described semiconductor package are inserted into a drain lead slot, a source lead slot and a gate lead slot in the circuit substrate, respectively, and are then secured with solder, for example. In this manner, the GaN-HEMI 63 included in the above-described semiconductor package is connected to the PFC circuit formed on the circuit substrate.

In this PFC circuit, one terminal of the choke coil 61 and the anode terminal of the diode 64 are connected to the drain electrode 5 in the GaN-HEMI 63. One terminal of the first capacitor 62 is connected to the other terminal of the choke coil 61, and one terminal of the second capacitor 65 is connected to the cathode terminal of the diode 64. The other terminal of the first capacitor 62, the source electrode 4 in the GaN-HEMT 63 and the other terminal of the second capacitor 65 are grounded. A pair of terminals of the diode bridge 60 is connected to the two terminals of the first capacitor 62, and the other pair of terminals of the diode bridge 60 is connected to input terminals for receiving an alternating current (AC) voltage. The two terminals of the second capacitor 65 are connected to output terminals for outputting a direct current (DC) voltage. A gate driver, which is not illustrated, is connected to the gate electrode 3 in the GaN-HEMT 63. In this PFC circuit, by activating the GaN-HEMT 63 by the gate driver, an AC voltage received through the input terminals is converted into a DC voltage, which is output from the output terminals.

Accordingly, the power supply apparatus according to the present embodiment has an advantage of improving the reliability. More specifically, since this power supply apparatus has a semiconductor chip 56 according to any one of the above-described embodiments and their variants, a reliable power supply apparatus can be constructed.

While the above-described embodiment has been described wherein the above-described semiconductor device (semiconductor package including a GaN-HEMT or GaN-HEMT) is used in a PFC circuit provided in a power supply apparatus for a server, this is not limiting. For example, the above-described semiconductor device (semiconductor package including a GaN-HEMT or GaN-HEMT) may also be used in electronic appliances (electronic apparatuses), such as non-server computers. Alternatively, the above-described semiconductor device (semiconductor package) may also be used for other circuits provided in a power supply apparatuses (e.g., DC-DC converters).

[Others]

Note that the present disclosure is not limited to the configurations of the embodiments and their variants set forth above, and may be modified in various manners without departing from the sprit of the present disclosure.

For example, although the above-described embodiments have been described in the context wherein the present disclosure is applied to a GaN-based transistor, this is not limiting. For example, the present disclosure may be applied to field-effect transistors having other structures as semiconductor stacked structures.

For example, although a gate electrode includes an Al layer in the above-described embodiments, this is not limiting. For example, the gate electrode may have any structure, as long as the gate electrode includes at least one layer including a material selected from Pt, Ir, W, Ni, Ti, Au, Cu, Ag, Pd, Zn, Cr, Al, Mn, Ta, Si, TaN, TiN, Ru, CoSi (e.g., $CoSi_2$), WSi (e.g., $WSi_2$), NiSi, MoSi (e.g., $MoSi_2$), TiSi (e.g., $TiSi_2$), AlSi (e.g., an Al—Si compound), Al—Cu (e.g., an Al—Cu compound), and AlSiCu (e.g., an Al—Si—Cu compound).

For example, although a gate insulation film is an AlO film in the above-described embodiments, this is not limiting. For example, the gate insulation film may be any film, as long as the gate insulation film includes at least one layer including a material selected from AlO (e.g., $Al_2O_3$), SiN, SiO (e.g., $SiO_2$), HfO (e.g., $HfO_2$), and AlN. Similarly, although an insulation film covering the gate insulation film is an AlO film in the above-described embodiments, this is not limiting. For example, the insulation film covering the gate insulation film may be any film, as long as it includes at least one layer including a material selected from AlO (e.g., $Al_2O_3$), SiN, SiO (e.g., $SiO_2$), HfO (e.g., $HfO_2$), and AlN.

Furthermore, for example, in the above-described first to fifth and eleventh to sixteenth embodiments, a layer (adhesion layer), provided at least one of between the gate electrode 3 and the electrode material diffusion suppression layer 6, and between gate insulation film 2 and the electrode material diffusion suppression layer 6, including at least one layer including any material selected from Pt, Ir, W, Ni, Ti, Au, Cu, Ag, Pd, Zn, Cr, Al, Mn, Ta, Si, TaN, TiN, Ru, CoSi (e.g., $CoSi_2$), WSi (e.g., $WSi_2$), NiSi, MoSi (e.g., $MoSi_2$), TiSi (e.g., $TiSi_2$), AlSi (e.g., an Al—Si compound), AlCu (e.g., an Al—Cu compound), and AlSiCu (e.g., an Al—Si—Cu compound), may be included.

Furthermore, for example, in the above-described sixth to sixteenth embodiments, a layer (adhesion layer), provided at least one of between the Au interconnection 9 and the electrode material diffusion suppression layer 6 (the second electrode material diffusion suppression layer 6X), and between the Al layer included in the ohmic electrodes 4 and 5 and the electrode material diffusion suppression layer 6 (the second electrode material diffusion suppression layer 6X), including at least one layer including any material selected from Pt, Ir, W, Ni, Ti, Au, Cu, Ag, Pd, Zn, Cr, Al, Mn, Ta, Si, TaN, TiN, Ru, CoSi (e.g., $CoSi_2$), WSi (e.g., $WSi_2$), NiSi, MoSi (e.g., $MoSi_2$), TiSi (e.g., $TiSi_2$), AlSi (e.g., an Al—Si compound), AlCu (e.g., an Al—Cu compound), and AlSiCu (e.g., an Al—Si—Cu compound), may be included.

Furthermore, for example, in the above-described first to fifth and sixteenth embodiments, an Au interconnection may be made from other low-resistance interconnection materials. Furthermore, in the above-described first to fifth and sixteenth embodiments, a layer (adhesion layer), provided at least one of between the Au interconnection 9 and the barrier metal 8, and between the Al layer included in the ohmic electrodes 4 and 5 and the barrier metal layer 8, including at least one layer including any material selected from Pt, Ir, W, Ni, Ti, Au, Cu, Ag, Pd, Zn, Cr, Al, Mn, Ta, Si, TaN, TiN, Ru, CoSi (e.g., $CoSi_2$), WSi (e.g., $WSi_2$), NiSi, MoSi (e.g., $MoSi_2$), TiSi (e.g., $TiSi_2$), AlSi (e.g., an Al—Si compound), AlCu (e.g., an Al—Cu compound), and AlSiCu (e.g., an Al—Si—Cu compound), may be included.

Furthermore, for example, in the above-described sixth to tenth and sixteenth embodiments, a layer (adhesion layer), provided between the gate electrode 3 and the gate insulation film 2, including at least one layer including any material selected from Pt, Ir, W, Ni, Ti, Au, Cu, Ag, Pd, Zn, Cr, Al, Mn, Ta, Si, TaN, TiN, Ru, CoSi (e.g., $CoSi_2$), WSi (e.g., $WSi_2$), NiSi, MoSi (e.g., $MoSi_2$), TiSi (e.g., $TiSi_2$), AlSi (e.g., an Al—Si compound), AlCu (e.g., an Al—Cu compound), and AlSiCu (e.g., an Al—Si—Cu compound), may be included.

All examples and conditional language recited herein are intended for pedagogical purposes to aid the reader in understanding the invention and the concepts contributed by the inventor to furthering the art, and are to be construed as being without limitation to such For example recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. A semiconductor device comprising:
   an ohmic electrode comprising an Al layer;
   an Au interconnection; and
   an electrode material diffusion suppression layer, provided between the Al layer and the Au interconnection, comprising a first TaN layer, a Ta layer, and a second TaN layer stacked in sequence,
   wherein the electrode material diffusion suppression layer is provided over the Al layer, and
   the Au interconnection is provided over the electrode material diffusion suppression layer.

2. The semiconductor device according to claim 1, further comprising a layer, provided at least one of between the Au interconnection and the electrode material diffusion suppression layer and between the Al layer, and the electrode material diffusion suppression layer, comprising at least one layer including any material selected from Pt, Ir, W, Ni, Ti, Au, Cu, Ag, Pd, Zn, Cr, Al, Mn, Ta, Si, TaN, TiN, Ru, CoSi, WSi, NiSi, MoSi, TiSi, AlSi, AlCu, and AlSiCu.

3. The semiconductor device according to claim 1, wherein the electrode material diffusion suppression layer further comprises a Pt layer stacked on the second TaN layer.

4. The semiconductor device according to claim 1, wherein the electrode material diffusion suppression layer further comprises an Ag layer stacked on the second TaN layer.

5. The semiconductor device according to claim 1, wherein the electrode material diffusion suppression layer further comprises a Ti layer stacked on the second TaN layer.

6. The semiconductor device according to claim 1, wherein the electrode material diffusion suppression layer further comprises a Cu layer stacked on the second TaN layer.

7. The semiconductor device according to claim 1, wherein the first and second TaN layers have nitrogen contents of greater than 48% but not greater than 52%.

8. A power supply apparatus comprising:
   a semiconductor device comprising:
      an ohmic electrode comprising an Al layer;
      an Au interconnection; and
      an electrode material diffusion suppression layer, provided between the Al layer and the Au interconnection, comprising a first TaN layer, a Ta layer, and a second TaN layer stacked in sequence,
      wherein the electrode material diffusion suppression layer is provided over the Al layer, and
      the Au interconnection is provided over the electrode material diffusion suppression layer.

9. A method of manufacturing a semiconductor device, comprising:
   forming an ohmic electrode comprising an Al layer;
   forming an electrode material diffusion suppression layer by stacking a first TaN layer, a Ta layer, and a second TaN layer, in sequence, over the Al layer; and
   forming an Au interconnection over the electrode material diffusion suppression layer.

* * * * *